(12) United States Patent
Iwase

(10) Patent No.: US 10,988,631 B2
(45) Date of Patent: Apr. 27, 2021

(54) GAS BARRIER FILM AND METHOD OF PRODUCING A GAS BARRIER FILM

(71) Applicant: FUJIFILM Corporation, Tokyo (JP)

(72) Inventor: Eijiro Iwase, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 100 days.

(21) Appl. No.: 16/420,005

(22) Filed: May 22, 2019

(65) Prior Publication Data
US 2019/0338158 A1 Nov. 7, 2019

Related U.S. Application Data

(63) Continuation of application No. PCT/JP2017/039662, filed on Nov. 2, 2017.

(30) Foreign Application Priority Data

Nov. 30, 2016 (JP) .............................. JP2016-233060

(51) Int. Cl.
*C09D 133/12* (2006.01)
*C09D 7/40* (2018.01)
(Continued)

(52) U.S. Cl.
CPC ............ *C09D 133/12* (2013.01); *B05D 1/265* (2013.01); *C09D 7/69* (2018.01); *C23C 16/50* (2013.01)

(58) Field of Classification Search
CPC ........ C09D 7/69; C09D 133/12; B05D 1/265; C23C 16/50; B32B 9/045; B32B 27/08;
(Continued)

(56) References Cited

U.S. PATENT DOCUMENTS

2012/0287521 A1 11/2012 Kumagai
2014/0178700 A1 6/2014 Iwase et al.
2016/0368236 A1* 12/2016 Iwase ...................... B32B 27/08

FOREIGN PATENT DOCUMENTS

JP 2013-31794 A 2/2013
JP 5274342 B2 8/2013
(Continued)

OTHER PUBLICATIONS

International Preliminary Report on Patentability and Written Opinion of the International Searching Authority (forms PCT/IB/373, PCT/ISA/237 and PCT/IB/326), dated Jun. 13, 2019, for corresponding International Application No. PCT/JP2017/039662, with a translation of the Written Opinion.
(Continued)

*Primary Examiner* — Catherine A. Simone
(74) *Attorney, Agent, or Firm* — Birch, Stewart, Kolasch & Birch, LLP

(57) ABSTRACT

A gas barrier film includes on one surface of a transparent base material, a gas barrier layer having, combination of an inorganic layer and a base organic layer, and an overcoat layer including an organic compound and provided on a surface of the inorganic layer, which is most distant from the base material; and on a surface of the base material opposite to the surface on being provided the gas barrier layer, a hardcoat layer in which particles are dispersed in an organic compound, in which a diameter of the particles is smaller than a thickness of the overcoat layer, a pencil hardness of the hardcoat layer is equal to or higher than a pencil hardness of the overcoat layer, the pencil hardness of the overcoat layer is HB to 3H, and a difference of the pencil hardness between the overcoat layer and the hardcoat layer is within 2 grades.

18 Claims, 1 Drawing Sheet

(51) Int. Cl.
  *B05D 1/26* (2006.01)
  *C23C 16/50* (2006.01)
(58) Field of Classification Search
  CPC ............ B32B 27/20; B32B 2307/7246; B32B
             2307/7244; B32B 2307/536; B32B
             2457/202; B32B 2457/206; B32B
        2264/025; Y10T 428/25; Y10T 428/254
  USPC .................................................. 428/323, 327
  See application file for complete search history.

(56) References Cited

FOREIGN PATENT DOCUMENTS

| | | |
|---|---|---|
| JP | 2013-237264 A | 11/2013 |
| JP | 5736698 B2 | 6/2015 |
| JP | 2015-157411 A | 9/2015 |
| WO | WO 2011/096320 A1 | 8/2011 |
| WO | WO 2015/186613 A1 | 12/2015 |
| WO | WO 2016/043141 A1 | 3/2016 |

OTHER PUBLICATIONS

International Search Report (form PCT/ISA/210), dated Jan. 30, 2018, for corresponding International Application No. PCT/JP2017/039662, with an English translation.

\* cited by examiner

GAS BARRIER FILM AND METHOD OF PRODUCING A GAS BARRIER FILM

CROSS-REFERENCE TO RELATED APPLICATIONS

This application is a Continuation of PCT International Application No. PCT/JP2017/039662 filed on Nov. 2, 2017, which claims priority under 35 U.S.C. § 119(a) to Japanese Patent Application No. 2016-233060 filed on Nov. 30, 2016. Each of the above application(s) is hereby expressly incorporated by reference, in its entirety, into the present application.

BACKGROUND OF THE INVENTION

1. Field of the Invention

The present invention relates to a gas barrier film having excellent durability and a method of producing this gas barrier film.

2. Description of the Related Art

Gas barrier films that block moisture, oxygen, and the like are used to protect various members and materials.

For example, in the recent years, in a display device using an organic electroluminescent element (organic EL element) and a plastic liquid crystal, the organic EL element and the plastic liquid crystal have been sealed with a gas barrier film to protect the organic EL element and the plastic liquid crystal.

In addition, in organic photovoltaics (OPV), it is considered that since an OPV element is weak to moisture, a gas barrier film is caused to pressure-sensitively adhere to both surfaces of the OPV element.

A gas barrier film generally has a configuration in which a resin film such as a polyethylene terephthalate (PET) film is used as a base material and a gas barrier layer exhibiting gas barrier properties is formed on a surface of the base material.

In addition, as a configuration exhibiting high gas barrier properties, as described in JP2013-031794A, an organic and inorganic lamination type gas barrier film having one or more combinations of an inorganic layer and an organic layer, which is a base layer of the inorganic layer, as a gas barrier layer, on a base material has been known.

In an organic and inorganic lamination type gas barrier film, an inorganic layer exhibiting gas barrier properties is formed on an organic layer which is a base. Thus, regions in which an inorganic compound forming the inorganic layer is not easily deposited on the surface on which the inorganic layer is formed, such as unevenness and shadows of foreign substances, are removed, and an inorganic layer can be appropriately formed over the entire surface of a substrate without voids. As a result, the organic and inorganic lamination type gas barrier film exhibits high gas barrier properties.

In addition, the inorganic layer exhibiting gas barrier properties is hard and brittle. Accordingly, in a case where the inorganic layer is impacted from the outside, damage such as cracks easily occurs in the inorganic layer. Therefore, a configuration in which the gas barrier layer has an overcoat layer for protecting the inorganic layer and is provided on the uppermost inorganic layer in the organic and inorganic lamination type gas barrier film is also known.

In a case where a gas barrier film is used for OPV and organic EL elements, and the like, the gas barrier film is caused to pressure-sensitively adhere to the element with a gas barrier layer facing the element side to protect the element from moisture and the like.

For example, in a case where a gas barrier film is used for OPV, two gas barrier films are bonded to the OPV element while the gas barrier layers are arranged to face inward, so that the OPV element is sandwiched between the gas barrier films. Therefore, in this case, an easily adhesive layer formed on the surface of the gas barrier film opposite to the gas barrier layer, that is, the surface of the resin film, such as a PET film, or the surface of the resin film, which is the base material, becomes the outermost surface.

However, the resin film, such as a PET film, used as a base material is easily damaged by sliding contact with external members, mechanical impact, and the like.

Therefore, in the laminate in which the OPV element is sandwiched between the gas barrier films, the surface of the resin film, which is a base material, is damaged due to sliding contact with external members in the subsequent OPV (OPV module) production step. In addition, in a case where the base material is badly scratched, the gas barrier layer is also damaged.

The gas barrier film preferably has high transparency not to impair the properties of OPV. Therefore, it is known that a hardcoat layer having hardness higher than that of the resin film or the like and not affecting the gas barrier layer is formed on the surface (rear surface) of the base material opposite of the surface on which the gas barrier layer is provided in order to prevent damage to the resin film as a base material and secure the transparency of the gas barrier film.

For example, JP5736698B discloses a gas barrier film (gas barrier hardcoat film) in which two or more barrier films including an inorganic oxide layer which has a film thickness of 5 to 300 nm and includes silicon oxide and a protective layer which is formed on the inorganic oxide layer and is formed of a metal alkoxide (or a hydrolyzate thereof) as a raw material on another base material are laminated on the rear surface of a hardcoat film obtained by forming a hardcoat layer on a base material.

In addition, JP2013-031794A discloses a gas barrier film (gas barrier laminate) having a base material, a gas barrier layer formed on a first surface of the base material, and a hardcoat layer having a urethane layer and a hydroxyl group formed on a second surface of the base material in order, in which a ratio $\alpha/\beta$ of an isocyanate group amount $\alpha$ and a hydroxyl group amount $\beta$ in the urethane layer is 1.5 to 2.0.

SUMMARY OF THE INVENTION

In the above-mentioned organic and inorganic lamination type gas barrier film, in a case where the hardcoat layer is provided on the rear surface, various properties, such as that the hardcoat layer has sufficient hardness (strength) and also the overcoat layer sufficiently protects the inorganic layer so that gas barrier properties are not deteriorated, the overcoat layer is provided on the inorganic layer with sufficient adhesiveness, and curling hardly occurs, are required.

In addition, the gas barrier film can be produced by a so-called roll to roll process, and further, in a case where the gas barrier film is used for various applications such as OPV, it is also required that treatment by a Roll to Roll process can be carried out in the production step.

However, an organic and inorganic lamination type gas barrier film having a hardcoat layer which sufficiently satisfies these requirements has not been realized.

An object of the present invention to solve such problems in the related art and to provide a gas barrier film, as an organic and inorganic lamination type gas barrier film, which includes an overcoat layer having high adhesiveness to an inorganic layer and capable of appropriately protecting the inorganic layer, and a hardcoat layer having sufficient hardness and capable of preventing damage, further, exhibits less curling, and can be suitably used for production and treatment by a roll to roll process.

In order to achieve this object, there is provided a gas barrier film according to the present invention comprising: on one surface of a transparent base material, a gas barrier layer having one or more combinations of an inorganic layer and an organic layer, which is a base layer of the inorganic layer, and an overcoat layer including an organic compound and provided on a surface of the inorganic layer, which is most distant from the base material, of the inorganic layers; and on a surface of the base material opposite to the surface on which the gas barrier layer is provided, a hardcoat layer in which particles are dispersed in an organic compound, in which a particle diameter of the particles of the hardcoat layer is smaller than a thickness of the overcoat layer, a pencil hardness of the hardcoat layer is equal to or higher than a pencil hardness of the overcoat layer, and the pencil hardness of the overcoat layer is HB to 3H, and a difference between the pencil hardness of the overcoat layer and the pencil hardness of the hardcoat layer is within 2 grades.

In the gas barrier film according to the present invention, it is preferable that the thickness of the overcoat layer is thicker than a thickness of the hardcoat layer.

Preferably, the particle diameter of the particles of the hardcoat layer is 0.4 to 1.8 μm.

Preferably, the overcoat layer has a thickness of 2 to 15 μm.

Preferably, the hardcoat layer has a thickness of 2 to 7 μm.

Preferably, the hardcoat layer includes a polymer of a (meth)acrylate polymer, a polymer of a (meth)acrylate monomer, and a polymer of the (meth)acrylate polymer and the (meth)acrylate monomer.

Preferably, the particles of the hardcoat layer are formed of polymethyl methacrylate.

Preferably, the inorganic layer has a thickness of 10 to 100 nm.

A method of producing a gas barrier film according to the present invention comprises forming all the inorganic layers of the gas barrier layer on the one surface of the transparent base material and then forming the hardcoat layer on the surface of the base material opposite to the surface on which the gas barrier layer is provided.

In the method of producing a gas barrier film according to the present invention, it is preferable that the gas barrier layer is formed on the one surface of the transparent base material and then the hardcoat layer is formed on the surface of the base material opposite to the surface on which the gas barrier layer is provided.

It is preferable that the gas barrier film according to the present invention is produced by the method of producing a gas barrier film.

According to the present invention, it is possible to realize a gas barrier film, as an organic and inorganic lamination type gas barrier film, which includes an overcoat layer having high adhesiveness to an inorganic layer and capable of appropriately protecting the inorganic layer, and a hardcoat layer having sufficient hardness and capable of preventing damage, and further exhibits less curling, and can be suitably used for production and treatment by a roll to roll process, and a method of producing a gas barrier film.

DESCRIPTION OF THE PREFERRED EMBODIMENTS

Hereinafter, a gas barrier film and a method of producing a gas barrier film according to embodiments of the present invention will be described in detail based on suitable examples shown in the accompanying drawings.

Figure 1:
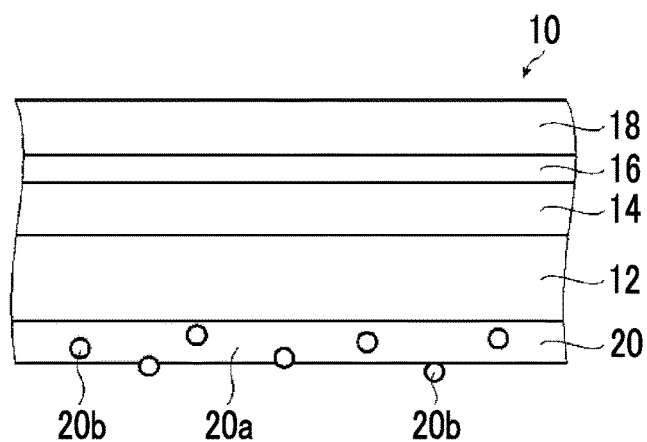
FIG. 1 is a diagram conceptually showing an example of a gas barrier film according to the present invention.

FIG. 1 shows an example of a gas barrier film according to the present invention.

A gas barrier film 10 shown in FIG. 1 has a base material 12, a base organic layer 14 provided on one surface of the base material 12, an inorganic layer 16 to be formed on (the surface of) the base organic layer 14, an overcoat layer 18 to be formed on the inorganic layer 16, and a hardcoat layer 20 provided on a surface of the base material 12 opposite to the surface on which the inorganic layer 16 or the like is provided.

In the gas barrier film 10, a gas barrier layer is formed by the base organic layer 14, the inorganic layer 16, and the overcoat layer 18. The gas barrier film 10 is configured such that the overcoat layer 18 forms one surface and the hardcoat layer 20 forms the surface opposite to the overcoat layer 18 (the surface of the other side).

In the following description, the term "gas barrier film 10" refers to a "barrier film 10", the term "overcoat layer 18" refers to an "OC layer 18", and the term "hardcoat layer 20" refers to an "HC layer 20".

The barrier film 10 has one base organic layer 14, one inorganic layer 16, and one OC layer 18 on one surface of the base material 12 and has one combination of the base organic layer 14 and the inorganic layer 16.

However, the barrier film according to the embodiment of the present invention can adopt various layer configurations, in addition to this configuration.

For example, a configuration in which two combinations of the base organic layer 14 and the inorganic layer 16 are provided and the OC layer 18 is provided thereon may be adopted. Alternatively, a configuration in which three or more combinations of base organic layer 14 and the inorganic layer 16 are provided and the OC layer 18 is provided thereon may be adopted. Alternatively, a configuration in which one or more combinations of the base organic layer 14 and the inorganic layer 16 is provided on the inorganic layer 16 provided on the surface of the base material 12 and further, the OC layer 18 is provided thereon may be adopted.

Generally, as the number of combinations of the base organic layer 14 and the inorganic layer 16 increases, higher gas barrier properties are obtained.

That is, the gas barrier film according to the embodiment of the present invention can adopt various configurations as long as the gas barrier film has at least one combination of the base organic layer 14 and the inorganic layer 16, the OC layer 18 provided on the surface of the inorganic layer 16, which is most distant from the base material 12, of the inorganic layers 16, and the HC layer 20 provided on the surface of the base material 12 opposite to the surface on which the OC layer 18 is provided. Among these, from the viewpoint of productivity and costs, the configuration shown in FIG. 1 in which one base organic layer 14 and one inorganic layer 16 are provided and the OC layer 18 is provided on the inorganic layer 16 is suitably used.

In the barrier film 10, various known sheet-like materials used as base materials in various gas barrier films and various lamination type functional films can be used as the base material 12 as long as the materials are transparent.

The term "transparent" means that the total light transmittance is 80% or more. In addition, the total light transmittance may be measured according to JIS K 7361 using a commercially available measuring device such as NDH5000 or SH-7000 manufactured by Nippon Denshoku Industries Co., Ltd.

Specific suitable examples of the base material 12 include films formed of various resin materials (resin films) such as polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), transparent polyimide, a polymethyl methacrylate resin (PMMA), polycarbonate (PC), polyacrylate, polymethacrylate, polypropylene (PP), polystyrene (PS), acrylonitrile-butadiene-styrene copolymers (ABS), a cycloolefin copolymer (COC), a cycloolefin polymer (COP), and triacetyl cellulose (TAC).

In the present invention, for the base material 12, layers (films) for obtaining various functions, such as a protective layer, an adhesive layer, a light reflecting layer, an antireflection layer, a light blocking layer, a planarization layer, a buffer layer, and a stress relaxation layer, may be formed on the surface of such a resin film.

The thickness of the base material 12 may be appropriately set according to applications, forming materials, and the like.

According to the studies of the present invention, the thickness of the base material 12 is preferably 5 to 150 µm and more preferably 10 to 100 µm.

It is preferable that the thickness of the base material 12 is set to be in the above range from the viewpoint of being capable of sufficiently securing the mechanical strength of the barrier film 10, achieving weight reduction and thickness reduction of the barrier film 10, securing flexibility, and the like.

In the barrier film 10, the base organic layer 14 as the base layer of the inorganic layer 16 is provided on the base material 12.

The base organic layer 14 is a layer formed of an organic compound (organic substance), and is basically formed by polymerizing (crosslinking or curing) a polymerizable composition such as a monomer or oligomer, which is the base organic layer 14.

The base organic layer 14 functions as a base layer for appropriately forming the inorganic layer 16 mainly exhibiting gas barrier properties in the barrier film 10.

By providing such a base organic layer 14, the unevenness of the surface of the base material 12 and foreign substances attached to the surface of the base material 12 are embedded therein and the deposition surface of the inorganic layer 16 can be made in a state suitable for film formation of the inorganic layer 16. Thus, regions in which an inorganic compound which is the inorganic layer 16 is not easily deposited, such as unevenness or shadows of foreign substances on the surface of the base material 12, are removed and the inorganic layer 16 can be appropriately formed over the entire surface of the substrate without voids.

In the barrier film 10, the material for forming the base organic layer 14 is not limited and various known organic compounds can be used.

Specifically, thermoplastic resins such as polyester, a (meth)acrylic resin, a methacrylic acid-maleic acid copolymer, polystyrene, a transparent fluorine resin, polyimide, fluorinated polyimide, polyamide, polyamide imide, polyether imide, cellulose acylate, polyurethane, polyether ether ketone, polycarbonate, alicyclic polyolefin, polyarylate, polyether sulfone, polysulfone, fluorene ring-modified polycarbonate, alicyclic ring-modified polycarbonate, fluorene ring-modified polyester, and an acryl compound, polysiloxane, and films of other organic silicon compounds can be suitably exemplified. A plurality of these materials may be used in combination.

Among these, from the viewpoint of high glass transition temperature, excellent hardness, and the like, the base organic layer 14 which is formed of a polymerization product of a radically curable compound and/or a cationically curable compound having an ether group as a functional group is suitable.

Among these, particularly, from the viewpoint of excellent optical properties such as low refractive index and high transparency, acrylic resins or methacrylic resins having a polymer of acrylate and/or methacrylate monomers or oligomers, as the main component are suitably exemplified as the material for the base organic layer 14.

Among these, particularly, acrylic resins or methacrylic resins having a polymer of bifunctional or higher, particularly, trifunctional or higher acrylate and/or methacrylate monomers or oligomers, as a main component, such as dipropylene glycol di(meth)acrylate (DPGDA), trimethylolpropane tri(meth)acrylate (TMPTA), and dipentaerythritol hexa(meth)acrylate (DPHA), can be suitably exemplified for the material for the organic layer. Further, it is also preferable to use a plurality of acrylic resins or methacrylic resins described above.

In addition, organic layers including organic compounds exemplified in the description of the OC layer 18 and the HC layer 20 described later can be suitably used as the base organic layer 14.

The thickness of the base organic layer 14 may be appropriately set according to the material for forming the base organic layer 14 and the base material 12. According to the studies of the present inventors, the thickness of the base organic layer 14 is preferably 0.5 to 5 µm and more preferably 1 to 3 µm.

By setting the thickness of the base organic layer 14 to 0.5 µm or more, the unevenness of the surface of the base material 12 and the foreign substances attached to the surface of the base material 12 are embedded therein and the surface of the base organic layer 14, that is, the deposition surface for the inorganic layer 16 can be made flat.

In addition, by setting the thickness of the base organic layer 14 to 5 µm or less, it is possible to suitably suppress the occurrence of problems of cracks of the base organic layer 14, curling of the barrier film 10, and the like caused by an excessively thick base organic layer 14.

In a case of providing a plurality of base organic layers 14, the thickness of each base organic layer 14 may be the same as or different from each other. In addition, the material for forming each base organic layer 14 may be the same as or different from each other.

Such a base organic layer 14 may be formed (deposited) by using a known method of forming a layer formed of an organic compound according to the base organic layer 14 to be formed.

For example, the base organic layer 14 may be formed by a so-called coating method including preparing a polymerizable composition (coating composition) including an organic solvent, an organic compound (monomer, dimer, oligomer, polymer and the like) which is the base organic layer 14, a surfactant, a silane coupling agent, and the like, applying and drying the polymerizable composition, and further polymerizing (crosslinking) the organic compound by irradiation with ultraviolet rays, as required.

In addition, the base organic layer 14 is preferably formed by a so-called roll to roll process. In the following description, the "roll to roll" is also referred to as "R to R".

As is well known, R to R is a production method in which a long base material is drawn from a material roll formed by winding the base material in a roll shape, film formation is carried out while the drawn base material is transported in a longitudinal direction, and the base material on which a film is formed is wound in a roll shape. By using R to R, high productivity and production efficiency can be obtained.

The inorganic layer 16 is a layer formed of an inorganic compound.

In the barrier film 10, the inorganic layer 16 mainly exhibits desired gas barrier properties.

The material for forming the inorganic layer 16 is not limited and various inorganic layers used for known gas barrier layers and formed of inorganic compounds exhibiting gas barrier properties can be used.

Specifically, films formed of inorganic compounds including metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; oxides of silicon such as silicon oxide, silicon oxynitride, silicon oxycarbide, and silicon oxynitrocarbide; nitrides of silicon such as silicon nitride and silicon nitrocarbide; carbides of silicon such as silicon carbide; hydrides of these compounds; mixtures of two or more kinds of these compounds; and hydrogenated products thereof are suitably exemplified. Further, a mixture of two or more of these compounds can also be used.

Particularly, silicon nitride, silicon oxide, silicon oxynitride, aluminum oxide, and a mixture of two or more thereof are suitably used since these compounds have high transparency and are capable of exhibiting excellent gas barrier properties. Among these, particularly, a silicon compound is suitably used since silicon nitride has high transparency as well as excellent gas barrier properties.

The thickness of the inorganic layer 16 at which desired gas barrier properties can be exhibited may be appropriately determined according to the forming material. According to the studies of the present inventors, the thickness of the inorganic layer 16 is preferably 10 to 100 nm, more preferably 15 to 50 nm, and particularly preferably 18 to 35 nm.

By setting the thickness of the inorganic layer 16 to 10 nm or more, the inorganic layer 16 that stably exhibits sufficient gas barrier properties can be formed. In addition, the inorganic layer 16 is generally brittle, and in a case where the inorganic layer is excessively thick, there is a possibility of occurrence of splits, cracks, lines, peeling, or the like, whereas by setting the thickness of the inorganic layer 16 to 100 nm or less, the occurrence of splits can be prevented.

As will be described in detail later, in the present invention, the OC layer 18 having a pencil hardness of HB to 3H and having a thickness larger than the particle diameter of the particles 20*b* of the HC layer 20 described later is provided and thus, in a case where the inorganic layer 16 is a very thin layer of 10 nm or the like, the damage of the inorganic layer 16 can be sufficiently prevented.

In a case where a plurality of inorganic layers 16 are provided, the thickness of each inorganic layer 16 may be the same as or different from each other. In addition, the material for forming each inorganic layer 16 may be the same as or different from each other.

In the barrier film 10, the method of forming the inorganic layer 16 is not limited and various known methods of forming an inorganic layer (inorganic film) can be used according to the inorganic layer 16 to be formed.

Specifically, the inorganic layer 16 may be formed by plasma CVD such as capacitively coupled plasma (CCP)-chemical vapor deposition (CVD) or inductively coupled plasma (ICP)-CVD, sputtering such as magnetron sputtering or reactive sputtering, and a vapor phase film formation method such as vacuum vapor deposition.

The inorganic layer 16 is also preferably formed by R to R.

On the inorganic layer 16, the OC layer 18 is provided.

The OC layer 18 is a layer for protecting the inorganic layer 16 to prevent the damage of the inorganic layer 16.

In the present invention, the OC layer 18 is a layer including an organic compound, and although described in detail later, the OC layer is a layer having a thickness larger than the particle diameter of the particles 20*b* contained in the HC layer 20 described later and having a pencil hardness of HB to 3H. Further, the pencil hardness of the OC layer 18 is equal to or lower than the pencil hardness of the HC layer 20 described later and a difference between the pencil hardness of the OC layer 18 and the pencil hardness of the HC layer 20 is within 2 grades.

In the present invention, the pencil hardness may be measured according to JIS K 5600-5-4.

The pencil hardness is indicated by grades HB, F, H, 2H, and 3H in order from HB to 3H. The difference in pencil hardness being within 2 grades means that, for example, a relationship of HB and H or H and 3H may be mentioned, and the grade difference is within 2 grades.

For the OC layer 18, as long as the flowing conditions are satisfied, various known layers including organic compounds (organic substances) (organic layers) can be used.

Examples of the OC layer 18 include layers formed of various organic compounds exemplified in the description of the above-mentioned base organic layer 14.

As a more preferable OC layer 18, an OC layer 18 containing a polymerization product of a graft copolymer having an acrylic polymer as the main chain and having at least one of a urethane polymer with an acryloyl group at the terminal or a urethane oligomer with an acryloyl group at the terminal in the side chain, a polymerization product of a trifunctional or higher (meth)acrylate monomer, a p polymerization product of the graft copolymer having an acrylic polymer as the main chain and having at least one of a urethane polymer with an acryloyl group at the terminal or a urethane oligomer with an acryloyl group at the terminal in the side chain and a trifunctional or higher (meth)acrylate monomer, a (meth)acrylate polymer, and a silane coupling agent having one or more (meth)acryloyl groups is exemplified.

The silane coupling agent includes various compounds produced from a silane coupling agent such as a hydrolyzate of a silane coupling agent, a hydrogen bonded product of a silane coupling agent, and a dehydration condensate of a silane coupling agent.

More specifically, it is preferable that the OC layer 18 is a layer formed by applying a polymerizable composition (coating composition) containing a graft copolymer having an acrylic polymer as the main chain and having at least one of a urethane polymer with an acryloyl group at the terminal or a urethane oligomer with an acryloyl group at the terminal in the side chain, a trifunctional or higher (meth)acrylate monomer, a (meth)acrylate polymer, and a silane coupling agent having one or more (meth)acryloyl groups to the inorganic layer 16, drying the polymerizable composition, and polymerizing (curing) the polymerizable composition.

In the following description, the "graft copolymer having an acrylic polymer as the main chain and having at least one of a urethane polymer with an acryloyl group at the terminal or a urethane oligomer with an acryloyl group at the terminal in the side chain" is also simply referred to as a "graft copolymer".

Such an OC layer 18 has high adhesiveness to the inorganic layer 16 by the graft copolymer and good hardness by polymerization between the graft copolymers, between the trifunctional or higher (meth)acrylate monomers, and between the graft copolymer and the trifunctional or higher (meth)acrylate monomer, and a decrease in adhesiveness between the OC layer and the inorganic layer 16 can be prevented by a reduction in the internal stress by containing the (meth)acrylate polymer, that is, by preventing shrinkage.

In addition, in the barrier film 10 according to the embodiment of the present invention, as the inorganic layer 16, a silicon nitride film is suitably used. Since the silicon nitride film is very dense and has a high density, for example, even in a case where the film is a very thin film of about 30 nm, very high gas barrier properties are obtained. That is, by using the silicon nitride film as the inorganic layer 16, a high quality gas barrier film having excellent gas barrier properties, a small thickness, high transparency and good flexibility is obtained.

However, in a case where the inorganic layer 16 is thin, the inorganic layer 16 is more easily damaged by the external force. Accordingly, in a case of using the inorganic layer 16 which is dense, has a high density, and exhibits high gas barrier properties with a small thickness, such as a silicon nitride film, the OC layer 18 is hard and the adhesiveness to the inorganic layer 16 is excellent, which are particularly important.

That is, in the barrier film 10 according to the embodiment of the present invention, by providing such an OC layer 18, the inorganic layer 16 is suitably protected, for example, in a case where the barrier film 10 is used for OPV or the like, and an OPV (OPV module) having high durability and capable of preventing deterioration of gas barrier properties and preventing deterioration of the OPV element due to moisture or the like for a long period of time can be realized.

The graft copolymer is a graft copolymer having an acrylic polymer as the main chain and having a urethane polymer with an acryloyl group at the terminal and/or a urethane oligomer with an acryloyl group at the terminal in the side chain.

The graft copolymer may be a copolymer having a structure in which urethane monomer units are arranged as the side chains in sites of the monomer units of the acrylic main chain as the backbone, or generally, may have a structure formed by graft copolymerization.

This graft copolymer is highly transparent and is not easily turned to yellow. An OC layer 18 having a low refractive index and a good light transmittance can be formed.

The acrylic main chain in the graft copolymer may be a homopolymer formed by homopolymerization of an acrylate monomer, an ethyl acrylate monomer, or the like, or may be a copolymer of any one of these monomers or a copolymer of any one of these monomers and another monomer. For example, it is preferable that the acrylic main chain is a copolymer obtained from (meth)acrylic acid ester and ethylene.

At least a part of the side chains bonded to the acrylic main chain are side chains including a urethane polymer unit or a urethane oligomer unit. The graft copolymer may have a plurality of urethane polymer units having different molecular weights and/or a plurality of urethane oligomer units having different molecular weights, respectively. The molecular weight of the urethane polymer unit is, for example, 3000 to 4000. In addition, the molecular weight of the urethane oligomer unit is, for example, 350 to 600. The graft copolymer may have both a side chain including a urethane polymer unit and a side chain including a urethane oligomer unit.

The acrylic main chain and the urethane polymer unit or the urethane oligomer unit may be bonded to each other directly or through another linking group. Examples of another linking group include an ethylene oxide group, a polyethylene oxide group, a propylene oxide group, and a polypropylene oxide group. The graft copolymer may include a plurality of side chains in which a urethane polymer unit or a urethane oligomer unit is bonded to the acrylic main chain through a different linking group (including a direct bond).

At least a part of the side chains including a urethane polymer unit or a urethane oligomer unit have an acryloyl group at the terminal. It is preferable that all the side chains including a urethane polymer unit or a urethane oligomer unit in the graft copolymer have acryloyl groups at the terminal.

The graft copolymer may have another side chain in addition to the side chain including a urethane polymer unit or a urethane oligomer unit. Examples of the other side chain include a linear or branched alkyl group. As the linear or branched alkyl group, a linear alkyl group having 1 to 6 carbon atoms is preferable, an n-propyl group, an ethyl group, or a methyl group is more preferable, and a methyl group is still more preferable.

The graft copolymer may have a structure including a plurality of side chains which are different, for example, in the molecular weight of a urethane polymer unit or a urethane oligomer unit or in a linking group, or may have a structure including the plurality of other side chains described above.

The weight-average molecular weight of the graft copolymer is preferably 10000 or more. In addition, the weight-average molecular weight of the graft copolymer is preferably 10000 to 300000, and the molecular weight of the graft copolymer is more preferably 10000 to 250000, and still more preferably 12000 to 200000.

It is preferable that the weight-average molecular weight of the graft copolymer is set to 10000 or more, from the viewpoint that the adhesiveness between the inorganic layer 16 and the OC layer 18 can be improved, an OC layer 18 having a desired thickness can be formed, curling of the barrier film 10 can be suppressed, the viscosity of the polymerizable composition is increased, and thickness unevenness can be controlled in drying.

By setting the weight-average molecular weight of the graft copolymer to 300000 or less, it is possible to easily adjust the dilution ratio of the polymerizable composition while appropriately maintaining the viscosity of the polymerizable composition and to perform control easily by increasing the amount of a solvent to be dried and decreasing the drying load.

In the present invention, the weight-average molecular weight (Mw) of various polymerization products (such as polymers, resins, and polymer materials) may be measured as a molecular weight in terms of polystyrene (PS) by gel permeation chromatography (GPC). More specifically, the weight-average molecular weight may be obtained by using HLC-8220 (manufactured by Tosoh Corporation), TSKgel Super AWM-H (manufactured by Tosoh Corporation, 6.0 mm ID×15.0 cm) as a column, a 10 mmol/L solution of lithium bromide in N-methylpyrrolidinone (NMP) as an eluant.

As the weight-average molecular weight of the polymer or the like, numerical values in catalogs and the like may be used.

The graft copolymer is an acrylic polymer having a urethane side chain with an acryloyl group at the terminal. The double bond equivalent (acrylic equivalent) of the graft copolymer is preferably 500 g/mol or more, more preferably 550 g/mol or more, and still more preferably 600 g/mol or more. The double bond equivalent is the weight-average molecular weight (polymer mass) per mole of a polymerizable double bond (that is, a (meth)acryloyl group) included in the graft copolymer.

It is preferable to set the double bond equivalent of the graft copolymer to 500 g/mol or more from the viewpoint that an increase in the internal stress by an unnecessary increase in the crosslinking density due to an excessive number of double bonds, that is, (meth)acryloyl groups at the terminal in the side chain is prevented so that an OC layer 18 having good adhesiveness to the inorganic layer 16 can be formed, and the curling of the barrier film 10 can be prevented.

The upper limit of the double bond equivalent of the graft copolymer is not particularly limited. However, in a case where the double bond equivalent is excessively high, that is, the number of (meth)acryloyl groups at the terminal in the side chain is too small, there is a possibility that defects such as insufficient crosslinking in the OC layer 18, leading to generation of aggregation peeling in the layer, lowered hardness of the OC layer 18, deterioration of a function of protecting the inorganic layer 16, and easy generation of defects such as scratches may be generated.

Taking the above-mentioned points into consideration, the double bond equivalent of the UV curable urethane polymer is preferably 2000 g/mol or less.

The double bond equivalent of the graft copolymer may be measured by a known method. In addition, as the double bond equivalent of the urethane polymer of the graft copolymer, the numerical values described in catalogs and the like may be used.

The refractive index of the polymerization product (cured product) of the graft copolymer is preferably 1.52 or less, and more preferably 1.50 or less.

By setting the refractive index of the polymerization product of the graft copolymer to 1.52 or less, a barrier film 10 having high transparency can be obtained.

In the present invention, the refractive index of various substances such as the polymerization product of the graft copolymer may be measured according to JIS K 7142 using a known refractive index measuring device. As an example of the refractive index measuring device, a multi-wavelength Abbe refractometer DR-M2, manufactured by ATAGO Co., Ltd. may be used.

In addition, as the refractive index, numerical values in catalogs and the like may be used.

As the graft copolymer, for example, commercially available products of ACRIT 8BR series, such as ACRIT 8BR-930, manufactured by Taisei Fine Chemical Co., Ltd., which is an ultraviolet curable urethane acrylic polymer may be used.

In addition, a plurality of graft copolymers may be used in combination.

The composition for forming the OC layer 18 contains a trifunctional or higher (meth)acrylate monomer.

As the trifunctional or higher (meth)acrylate monomer, various known trifunctional or higher (meth)acrylate monomers can be used.

Specific examples thereof include TMPTA, DPHA, epichlorohydrin (ECH)-modified glycerol tri(meth)acrylate, ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphoric acid triacrylate, caprolactone-modified trimethylolpropane tri(meth)acrylate, EO-modified TMPTA, PO-modified TMPTA, tris(acryloxyethyl) isocyanurate, dipentaerythritol hexa(meth)acrylate, caprolactone-modified DPHA, dipentaerythritol hydroxypenta (meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxytetra(meth)acrylate, and pentaerythritol tetra(meth)acrylate.

Further, a trifunctional or higher (meth)acrylate monomer in a compound represented by General Formula (1) can also be suitably used.

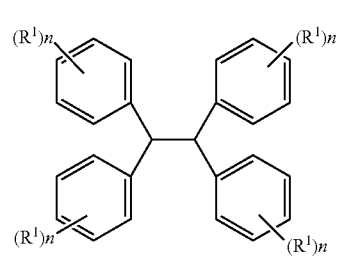

General Formula (1)

(In General Formula (1), $R^1$'s each represent a substituent and may be the same or different from each other. n's each represent an integer of 0 to 5 and may be the same or different from each other. Here, at least one of $R^1$'s contains a polymerizable group, and the total of polymerizable groups is 3 or more.)

Examples of the substituent of $R^1$ include groups formed by combining one or more of $—CR^2_2—$ ($R^2$ represents a hydrogen atom or a substituent), $—CO—$, $—O—$, a phenylene group, $—S—$, $—C≡C—$, $—NR^3—$ ($R^3$ represents a hydrogen atom or a substituent), $—CR^4=CR^5—$ ($R^4$ and $R^5$ each represent a hydrogen atom or a substituent), and a polymerizable group, and a group formed by combining one or more of $—CR^2_2—$ ($R^2$ represents a hydrogen atom or a substituent), $—CO—$, $—O—$, and a phenylene group, and a polymerizable group is preferable.

$R^2$ represents a hydrogen atom or a substituent and preferably represents a hydrogen atom or a hydroxy group.

At least one of $R^1$'s preferably includes a hydroxy group.

The molecular weight of at least one of $R^1$'s is preferably 10 to 250 and more preferably 70 to 150.

The position where $R^1$ is bonded is preferably bonded in at least the para position.

n's represent an integer of 0 to 5 and are preferably integers of 0 to 2 and more preferably 0 or 1. Still more preferably, all n's are 1.

In the compound represented by General Formula (1), at least two $R^1$'s preferably have the same structure. Further, it is more preferable that n's are all 1 and two out of four $R^1$'s have the same structure. It is still more preferable that n's are all 1 and four $R^1$'s have the same structure. The polymerizable group in General Formula (1) is preferably a (meth)acryloyl group or an epoxy group and more preferably a (meth)acryloyl group. The number of polymerizable groups in General Formula (1) is preferably 2 or more and more preferably 3 or more. In addition, the upper limit of the number of polymerizable groups in General Formula (1) is not particularly limited, but is preferably 8 or less and more preferably 6 or less.

The molecular weight of the compound represented by General Formula (1) is preferably 600 to 1400 and more preferably 800 to 1200.

Hereinafter, specific examples of the trifunctional or higher (meth)acrylate monomer in the compound represented by General Formula (1) will be shown, but the trifunctional or higher (meth)acrylate monomer in the compound represented by General Formula (1) is not limited thereto. In addition, in the trifunctional or higher (meth)acrylate monomer, a case in which four n's in General Formula (1) are all 1 will be exemplified, but cases in which one, two, or three of four n's in General Formula (1) are 0 or cases in which one, two, or three or more of four n's in General Formula (1) are 2 or more (compounds in which two or more $R^1$'s are bonded to a single ring) are also be exemplified as the trifunctional or higher (meth)acrylate monomer in the compound represented by General Formula (1).

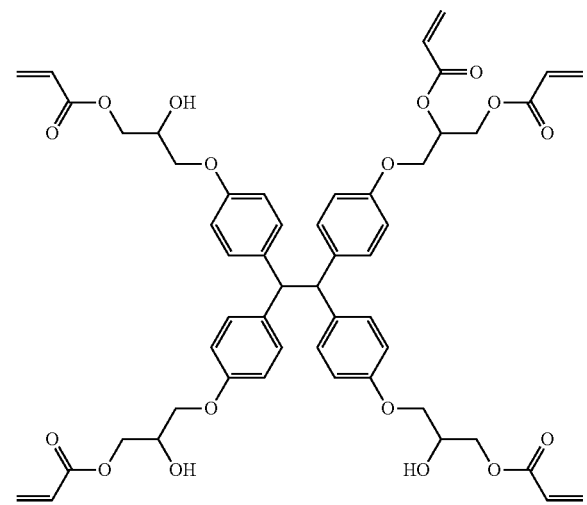

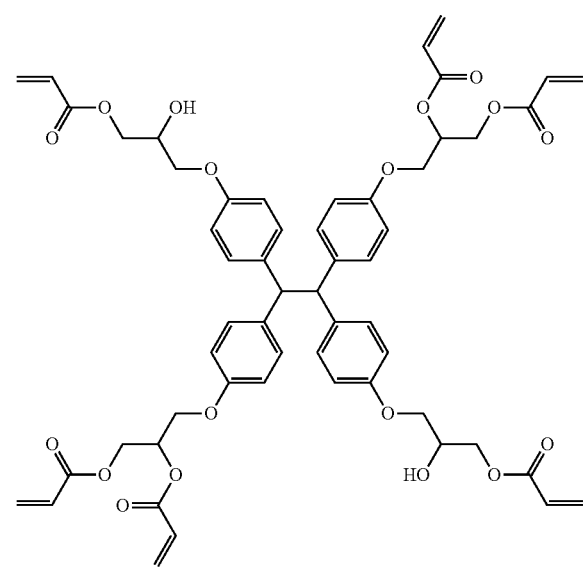

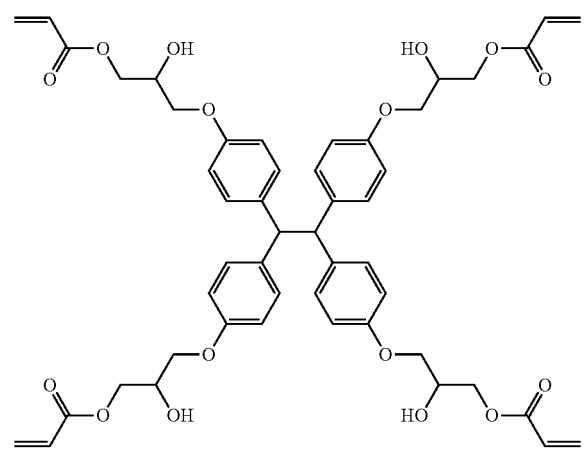

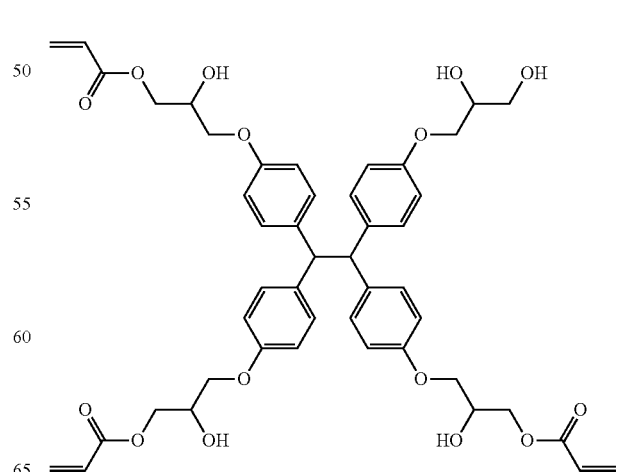

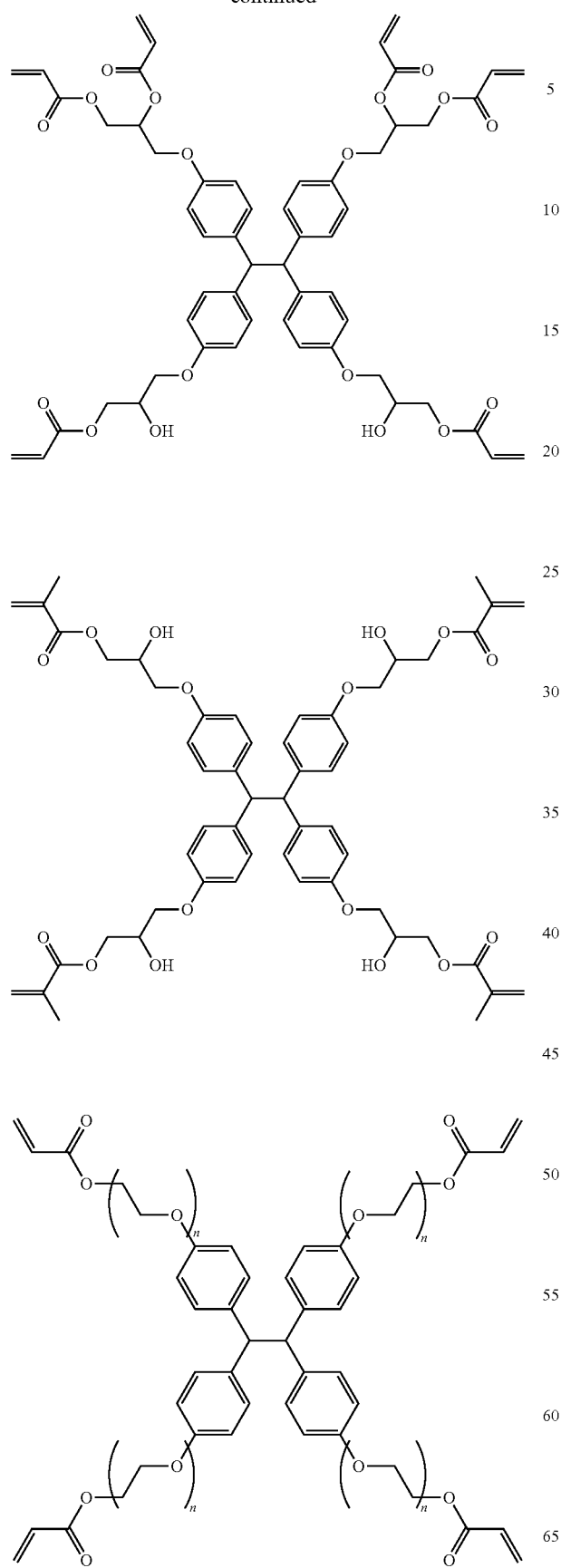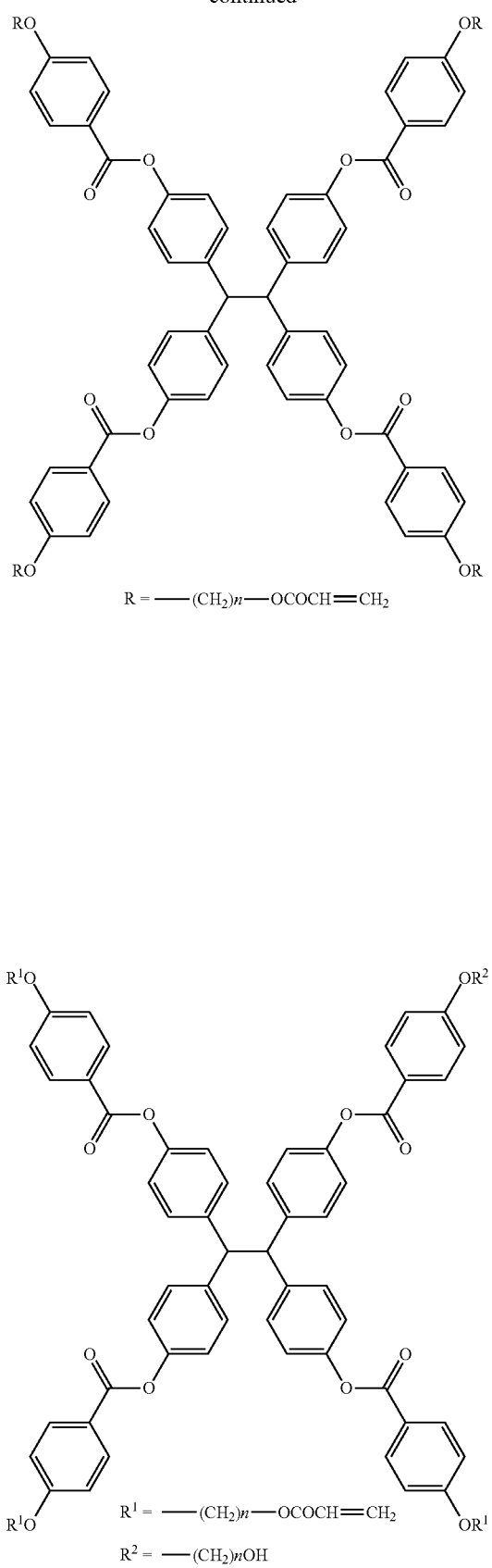

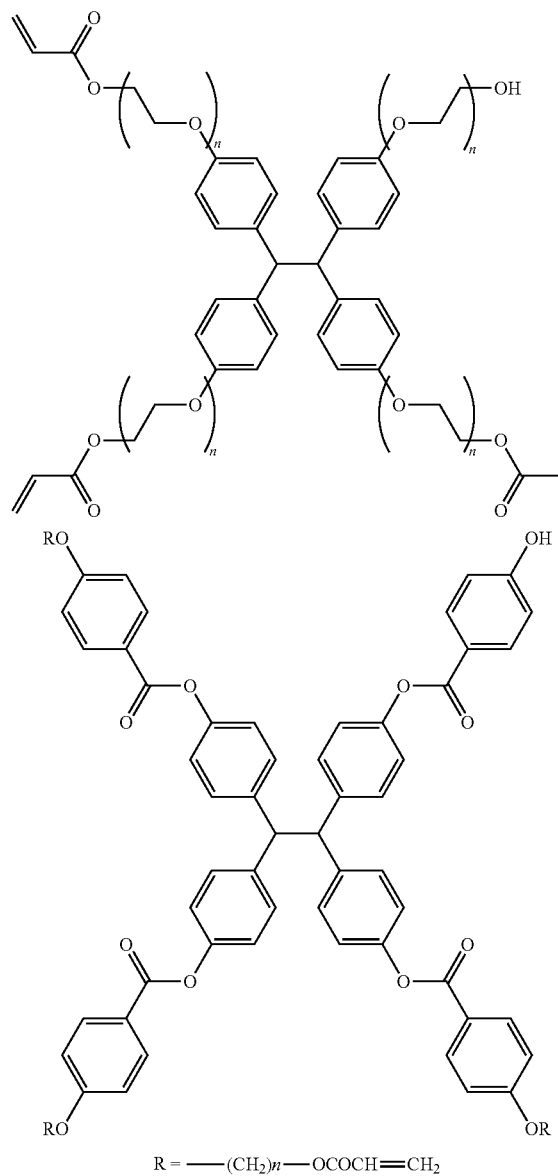

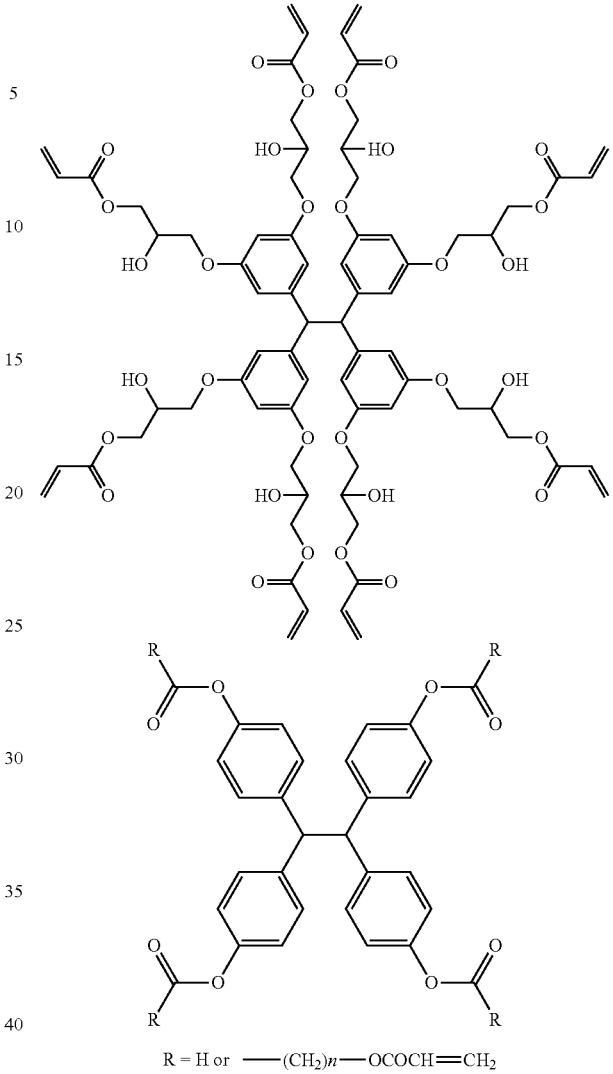

The trifunctional or higher (meth)acrylate monomer in the compound represented by General Formula (1) is available from commercially available products.

In addition, the trifunctional or higher (meth)acrylate monomer in the compound represented by General Formula (1) can also be synthesized using a known method. In a case where these (meth)acrylate monomers are synthesized, generally, isomers different from the desired (meth)acrylate monomer, and the like are also produced. In a case where the separation of these isomers is desired, these isomers can be separated by column chromatography.

In the present invention, among the trifunctional or higher (meth)acrylate monomers, DPHA, the trifunctional or higher (meth)acrylate monomers in the compound represented by General Formula (1), and the like are suitably used.

A plurality of trifunctional or higher (meth)acrylate monomers may be used in combination.

The polymerizable composition for forming the OC layer 18 contains a (meth)acrylate polymer.

The (meth)acrylate polymer may be an acrylate polymer, a methacrylate polymer, or a mixture of an acrylate polymer and a methacrylate polymer. Among these, a methacrylate polymer is suitably used since the OC layer 18 having high hardness can be obtained.

The molecular weight of the (meth)acrylate polymer is not particularly limited and the weight-average molecular weight is preferably 10000 or more, more preferably 20000 or more, and particularly preferably 40000 or more.

It is preferable to set the weight-average molecular weight of the (meth)acrylate polymer to 10000 or more, particularly 20000 or more, from the viewpoint that the shrinkage upon polymerization (curing) of the polymerizable composition is suppressed, and the adhesiveness between the inorganic layer 16 and the OC layer 18 can be increased.

As the (meth)acrylate polymer, a commercially available product can be suitably used.

Examples of the commercially available product of the (meth)acrylate polymer include DIANAL BR series manufactured by Mitsubishi Chemical Corporation.

The refractive index of the polymerization product (cured product) of the (meth)acrylate polymer is preferably 1.52 or less and more preferably 1.50 or less.

By setting the refractive index of the polymerization product of the (meth)acrylate polymer to 1.52 or less, a gas barrier film 10 having high transparency can be obtained.

Further, the composition for forming the OC layer 18 contains a silane coupling agent having one or more (meth)acryloyl groups.

As the silane coupling agent, various known silane coupling agents can be used as long as the silane coupling agent has one or more (meth)acryloyl groups. Specific examples thereof include 3-methacryloxypropyl methyl dimethoxysilane, 3-methacryloxypropyl trimethoxysilane, 3-methacryloxypropyl methyl diethoxysilane, 3-methacryloxypropyl triethoxysilane, and 3-acryloxypropyl trimethoxysilane.

In addition, as the silane coupling agent having one or more (meth)acryloyl groups, commercially available products can also be suitably used.

Examples of the commercially available products of the silane coupling agent having one or more (meth)acryloyl groups include KBM-5103, KBM-502, KBM-503, KBE-502, and KBE-503, manufactured by Shin-Etsu Silicone Co., Ltd.

In addition, as the OC layer 18, other than the above layers, a layer similarly formed using a polymerizable composition containing the above-mentioned graft copolymer and a urethane polymer can also be used.

The OC layer 18 may be formed by a known method. Specifically, a coating method in which a polymerizable composition for forming the OC layer 18 is prepared by dissolving or dispersing an organic compound in a solvent, this polymerizable composition is applied to the inorganic layer 16 and dried, and then the polymerizable composition is cured is preferable. In addition, it is preferable that the OC layer 18 is also formed by R to R.

For example, it is preferable to form the OC layer 18 by preparing a polymerizable composition for forming the OC layer 18 by dissolving or dispersing a graft copolymer, a trifunctional or higher (meth)acrylate monomer, a (meth)acrylate polymer, and a silane coupling agent having one or more (meth)acryloyl groups in a solvent, applying this polymerizable composition to the surface of the inorganic layer 16, drying the polymerizable composition, and then irradiating the polymerizable composition with ultraviolet rays to polymerize (cure) the polymerizable composition. As the solvent, a solvent in which each component can be dissolved or dispersed can be appropriately selected and used.

Here, in the polymerizable composition for forming the OC layer 18, the content of the graft copolymer is preferably 25% to 50% by mass and more preferably 30% to 45% by mass.

In addition, in the polymerizable composition for forming the OC layer 18, the content of the trifunctional or higher (meth)acrylate monomer is preferably 10% to 35% by mass and more preferably 15% to 30% by mass.

In addition, in the polymerizable composition for forming the OC layer 18, the content of the (meth)acrylate polymer is preferably 10% to 30% by mass and more preferably 15% to 25% by mass.

Further, in the polymerizable composition for forming the OC layer 18, the content of the silane coupling agent having one or more (meth)acryloyl groups is preferably 5% to 15% by mass and more preferably 7.5% to 12.5% by mass.

In the polymerizable composition for forming the OC layer 18, by setting the contents of these four components to be in the ranges, an OC layer 18 which is hard and has a sufficient thickness can be formed while high adhesiveness to the inorganic layer 16 is secured.

In the polymerizable composition for forming the OC layer 18, as required, a photopolymerization initiator may be added.

As the photopolymerization initiator, various known photopolymerization initiators can be used according to the component contained in the polymerizable composition.

Specific suitable examples of the photopolymerization initiator include commercially available products such as Irgacure series (for example, IRGACURE 651, IRGACURE 754, IRGACURE 184, IRGACURE 2959, IRGACURE 907, IRGACURE 369, IRGACURE 379, IRGACURE 819, and the like), Darocure series (for example, DAROCURE TPO, DAROCURE 1173, and the like), Quantacure PDO, all of which are manufactured by BASF, and Esacure series (for example, ESACURE TZM, ESACURE TZT, ESACURE KTO46, and the like), manufactured by Lamberti S. p.

The amount of the photopolymerization initiator added may be appropriately set according to the photopolymerization initiator to be used.

Specifically, the amount of the photopolymerization initiator added is preferably 0.5% to 5% by mass and more preferably 1% to 3% by mass with respect to the polymerizable components in the polymerizable composition. The polymerizable components refer to, in a case of the polymerizable composition for forming the OC layer 18, the graft copolymer and the trifunctional or higher (meth)acrylate monomer.

The OC layer 18 may have a polymerization product (cured product) of a urethane acrylate oligomer, as required. That is, the polymerizable composition for forming the OC layer 18 may contain a urethane acrylate oligomer, as required.

The barrier film 10 according to the embodiment of the present invention is preferably produced using so-called R to R. In addition, although described later, in the production of the barrier film 10, it is preferable that a protective film is laminated on the inorganic layer 16 in vacuum after the inorganic layer 16 is formed by a vapor phase deposition method such as plasma CVD, and before the inorganic layer 16 is brought into contact with a pass roller or the like, and wound. Accordingly, in this case, the OC layer 18 is formed by peeling off the protective film.

Here, the protective film is laminated in the vacuum and thus the protective film is relatively firmly stuck to the inorganic layer 16. Therefore, in a case where the protective film is peeled off to form the OC layer 18, the protective film is slightly transferred onto the surface of the inorganic layer 16.

Here, the protective film is generally formed using polyolefin such as PE.

Therefore, by containing a urethane acrylate oligomer having high adhesiveness to the polyolefin in the OC layer 18, the adhesiveness between the inorganic layer 16 and the OC layer 18 can be further improved.

As the urethane acrylate oligomer, various urethane oligomers having an acrylate at the terminal, which can be cured by ultraviolet rays, are available.

In the present invention, the oligomer is a molecule having a molecular weight of 1000 to 10000. In a case where the oligomer does not have a molecular weight distribution, the molecular weight means the molecular weight calculated from the chemical structural formula, and in a case where the oligomer has a molecular weight distribution, the molecular weight means the aforementioned weight-average molecular weight.

As the urethane acrylate oligomer, commercially available products can also be suitably used.

Examples of commercially available products of the urethane acrylate oligomer include functional oligomer CN series, manufactured by Sartomer Japan Inc., and photocurable oligomer NK series manufactured by Shin Nakamura Chemical Co., Ltd.

The refractive index of the polymerization product (cured product) of the urethane acrylate oligomer is preferably 1.52 or less and more preferably 1.50 or less.

By setting the refractive index of the polymerization product of the urethane acrylate oligomer to 1.52 or less, a gas barrier film 10 having high transparency can be obtained.

In the polymerizable composition for forming the OC layer 18, the content of the urethane acrylate oligomer is preferably 1% to 10% by mass and more preferably 3% to 7% by mass.

It is preferable to set the content of the urethane acrylate oligomer in the polymerizable composition to be in the above range from the viewpoint that the adhesiveness between the inorganic layer 16 and the OC layer 18 can be improved without impairing the hardness of the OC layer 18.

The OC layer 18 may contain particles functioning as a lubricant, as required. That is, the polymerizable composition for forming the OC layer 18 may contain particles functioning as a lubricant.

The thickness of the OC layer 18 is not particularly limited as long as the thickness is larger than the particle diameter of the particles 20b contained in the HC layer 20 described later. A thickness that can sufficiently protect the inorganic layer 16 may be appropriately set depending on the material for forming the OC layer 18, and the thickness of the OC layer 18 is preferably 2 to 15 μm and more preferably 7 to 10 μm.

It is preferable to set the thickness of the OC layer 18 to 2 μm or more from the viewpoint that it is possible to prevent the damage of the inorganic layer 16 due to an external force, to prevent the base material 12 from being stretched even in a case where heat or tension is applied to the barrier film 10, and to prevent the damage of the inorganic layer 16 due to heat or tension.

In addition, it is preferable to set the thickness of the OC layer 18 to 15 μm or less from the viewpoint that it is possible to prevent the barrier film 10 from being unnecessarily thickened, and to obtain the barrier film 10 having good flexibility and transparency.

The barrier film 10 comprises a gas barrier layer constituted of the base organic layer 14, the inorganic layer 16, and the OC layer 18. The barrier film 10 according to the embodiment of the present invention comprises the hardcoat layer 20 (HC layer 20) on the surface of the base material 12 opposite to the surface on which the gas barrier layer is provided.

In the barrier film 10 according to the embodiment of the present invention, the HC layer 20 is a layer formed by dispersing the particles 20b, which become a lubricant, in a binder 20a formed of an organic compound (base material, matrix).

Here, in the barrier film 10 according to the embodiment of the present invention, the particle diameter of the particles 20b contained in the HC layer 20 is smaller than the thickness of the OC layer 18. In addition, the pencil hardness of the HC layer 20 (binder 20a) is equal to or higher than the pencil hardness of the OC layer 18. The pencil hardness of the OC layer 18 is HB to 3H, and further, a difference between the pencil hardness of the OC layer 18 and the pencil hardness of the HC layer 20 is within 2 grades. By adopting such a configuration, as the barrier film 10 according to the embodiment of the present invention, a barrier film 10 which includes an OC layer 18 having high adhesiveness to the inorganic layer 16 and capable of suitably protecting the inorganic layer 16 and a HC layer 20 having a sufficient thickness, has less curling, and can be suitably used for production and treatment by R to R is realized.

In a case of using the gas barrier film for OPV (OPV module) or the like, for example, it is considered that the OPV element is sandwiched between two gas barrier films while the gas barrier layers are arranged to face the OPV element side.

Accordingly, in this configuration, the base material of the gas barrier film becomes the outermost layer. Here, generally, a resin film is used as the base material of the gas barrier film, and thus, the base material is easily damaged by sliding contact with an external member or the like.

In a case of using the gas barrier film for OPV, it is preferable that the gas barrier film has high transparency so that a large amount of light can reach the OPV element considering the power generation efficiency. That is, in a case of using the gas barrier film for OPV, if the base material of the gas barrier film is damaged, the properties of the OPV are deteriorated. Further, in extreme cases, the inorganic layer is also damaged and the gas barrier properties of the gas barrier film are significantly deteriorated.

As a method for preventing such damage, as described in JP5736698B and JP2013-031794A, a method of providing a hardcoat layer on the surface of the base material opposite to the surface on which the gas barrier layer is provided, that is, on the surface which is the outermost surface in a case of being used for OPV or the like is known.

Here, the gas barrier film is preferably produced by R to R, and for example, even in a case of being used for OPV or the like, it is further preferable that the gas barrier film can be treated by R to R in the production step.

However, since the hardcoat layer is generally formed by a coating method, the surface smoothness is very high. Therefore, the gas barrier film having the hardcoat layer cannot be stably and smoothly wound or unwound by R to R and the shape of winding is very poor. In addition, in a case where the shape of winding is poor, the inorganic layer may be damaged due to unevenness (recesses) generated on the rolls or the like in some cases.

As a method to solve such defects, there is a method of improving the slidability of the hardcoat layer by incorporating particles, which become a lubricant, in the hardcoat layer. In addition, as the hardcoat layer, which is the outermost surface, in a case of using the barrier film for OPV or the like, becomes harder, the more damage due to sliding contact or the like can be prevented.

However, according to the studies of the present inventors, in a case where such a hard hardcoat layer including particles as lubricant is used for an organic and inorganic lamination type gas barrier film, various defects that the gas barrier properties are deteriorated and the adhesiveness between the inorganic layer and the overcoat layer is deteriorated, curling occurs, and the like are caused.

The organic and inorganic lamination type gas barrier film has an overcoat layer for protecting the inorganic layer on the inorganic layer most distant from the base material in many cases.

However, in the organic and inorganic lamination type gas barrier film, in a case where the hardcoat layer has particles, depending on the particle diameter of the particles and the thickness of the overcoat layer, the particles and unevenness of the hardcoat layer caused by the particles strongly press the inorganic layer through the overcoat layer in a case where the gas barrier film is wound into a roll by R to R, and the inorganic layer is damaged.

In order to prevent the damage of the hardcoat layer, it is preferable that the hardcoat layer is hard. Here, in a case where the hardcoat layer is hard, it is necessary that the overcoat layer is made hard to suppress the curling of the gas barrier film.

However, in the organic and inorganic lamination type gas barrier film, the overcoat layer is very hard and is formed on a dense inorganic layer. Such an inorganic layer basically has a low adhesiveness to the organic layer. Therefore, in a case where the overcoat layer is made hard in accordance with the hardcoat layer, the adhesiveness between the inorganic layer and the overcoat layer, which is basically not high, is further deteriorated and the overcoat layer cannot protect the inorganic layer appropriately.

In order for the overcoat layer to appropriately protect the inorganic layer, it is very important to firmly stick the overcoat layer and the inorganic layer with sufficient adhesiveness and it is necessary to avoid deterioration of the adhesiveness between the overcoat layer and the inorganic layer. However, in a case where the hardness of the overcoat layer is lowered, the degree of curling of the gas barrier film is large due to a difference in hardness with the hardcoat layer.

In contrast, the barrier film 10 according to the embodiment of the present invention is configured such that the particle diameter of the particles 20b contained in the HC layer 20 is smaller than the thickness of the OC layer 18, the pencil hardness of the OC layer 18 is HB to 3H, and the pencil hardness of the HC layer 20 is equal to or higher than the pencil hardness of the OC layer 18, and further, a difference between the pencil hardness of the OC layer 18 and the pencil hardness of the HC layer 20 is within 2 grades.

Therefore, during winding of the gas barrier film by R to R, even in a case where the particles 20b and the unevenness of the HC layer 20 caused by the particles 20b press the OC layer 18, the effect of the pressing by the particles 20b on the inorganic layer 16 can be greatly reduced to prevent the damage of the inorganic layer 16 due to the particles 20b of the HC layer 20.

In addition, since the pencil hardness of the OC layer 18 is HB to 3H, the adhesiveness between the OC layer 18 and the inorganic layer 16 is high and the inorganic layer 16 can be protected by the OC layer 18 having sufficient hardness, so that from the outside, the damage of the inorganic layer 16 can be prevented and deterioration of the gas barrier properties can be prevented. Further, the pencil hardness of the HC layer 20 is equal to or higher than the pencil hardness of the OC layer 18 and a difference between the pencil hardness of the OC layer 18 and the pencil hardness of the HC layer 20 is within 2 grades, the damage to the HC layer 20 due to sliding contact with an external member or the like can be prevented. Further, the curling due to the difference between the hardness of the OC layer 18 and the hardness of the HC layer 20 and the damage of the OC layer 18 in a case where the film is wound by R to R can also be suppressed. Therefore, it is possible to obtain a high quality barrier film 10 which exhibits less curling and has no damage to the OC layer 18 and the HC layer 20.

Further, in the barrier film 10 according to the embodiment of the present invention, the thickness of the inorganic layer 16 is preferably 10 to 100 nm and is very thin. In the organic and inorganic lamination type barrier film 10 having such a thin inorganic layer 16, in a case where the hardness of the OC layer 18 is not sufficient or in a case where the adhesiveness between the OC layer 18 and the inorganic layer 16 is not sufficient, the inorganic layer 16 is easily damaged and deterioration of the gas barrier properties by the damage of the inorganic layer 16 becomes a great problem.

In contrast, by adopting the above configuration, in the barrier film 10 according to the embodiment of the present invention, in a case where the inorganic layer 16 has a very thin thickness such as 10 nm or the like, the damage of the inorganic layer 16 can be suitably prevented.

The OC layer 18 can be formed using various organic compounds.

Here, in a case where the pencil hardness of the OC layer 18 is lower than HB, defects that the OC layer 18 cannot sufficiently protect the inorganic layer 16, the OC layer 18 is damaged at handling or winding by R to R to cause a decrease in value as a product, the inorganic layer 16 is damaged from the damaged portion of the OC layer 18, or the like are caused.

In a case where the pencil hardness of the OC layer 18 is higher than 3H, defects that the adhesiveness between the OC layer 18 and the inorganic layer 16 is decreased, the OC layer 18 cannot sufficiently protect the inorganic layer 16, and the like are caused.

The pencil hardness of the OC layer 18 is preferably F to 3H and the pencil hardness of the OC layer 18 is more preferably H or higher.

In a case where the particle diameter of the particles 20b contained in the HC layer 20 is equal to or larger than the thickness of the OC layer 18, when the barrier film 10 is wound by R to R, defects that the damage of the inorganic layer 16 by the particles 20b and the unevenness of the HC layer 20 caused by the particles 20b cannot be prevented and the like are caused.

The thickness of the OC layer 18 is preferably 2 to 15 µm as described above.

The particle diameter of the particles 20b contained in the HC layer 20 is preferably 0.4 to 1.8 µm and more preferably 0.8 to 1.5 µm.

It is preferable to set the particle diameter of the particles 20b contained in the HC layer 20 to 0.4 µm or more from the viewpoint that the slidability of the HC layer 20 can be made suitable.

In addition, it is preferable to set the particle diameter of the particles 20b contained in the HC layer 20 to 1.8 µm or less from the viewpoint that the damage of the inorganic layer 16 caused by the particles 20b can be suitably prevented, and the haze of the barrier film 10 can be prevented from increasing.

In the barrier film 10 according to the embodiment of the present invention, it is required for the HC layer 20 to have the highest hardness to prevent damage.

In a case where the pencil hardness of the HC layer 20 (binder 20a) is lower than the pencil hardness of the OC layer 18, depending on the hardness of the OC layer 18, defects that the damage of the HC layer 20 caused by sliding contact with the outside, mechanical impact from the outside, and the like cannot be prevented and the like are caused.

In addition, in a case where a difference between the pencil hardness of the OC layer 18 and the pencil hardness of the HC layer 20 is more than 2 grades, defects that the degree of curling of the barrier film 10 caused by the difference between the pencil hardness of the OC layer 18 and the pencil hardness of the HC layer 20 is large, the OC layer 18 is damaged by the hardness difference with the HC layer 20 and the unevenness of the HC layer 20 when the barrier film is wound by R to R, the inorganic layer 16 is damaged from the damaged portion of the OC layer 18, the winding conditions in R to R cannot be set, and the like are caused.

The pencil hardness of the HC layer 20 is preferably H or higher and more preferably 2H or higher.

The thickness of the HC layer 20 is not particularly limited and the thickness that can secure sufficient hardness may be appropriately set according to the material for forming the HC layer 20 or the like. The thickness of the HC layer 20 is preferably 2 to 7 µm and more preferably 3 to 6 µm.

It is preferable to set the thickness of the HC layer 20 to 2 µm or more from the viewpoint that it is possible to prevent the damage of the base material 12 and the like by sufficiently exhibiting the effect of forming the HC layer 20, to prevent the damage of the HC layer 20, to cancel curling generated from the OC layer 18, and to maintain a state in which the inside haze is low even in a case where the layer has the particles 20b.

It is preferable to set the thickness of the HC layer 20 to 7 µm or less from the viewpoint that it is possible to prevent the barrier film 10 from becoming unnecessarily thick, to obtain the barrier film 10 having good flexibility and transparency, and to suppress the curling of the barrier film 10.

In order for the HC layer 20 (binder 20a) to properly hold the particles 20b, the thickness of the HC layer 20 is also preferably equal to or larger than the particle diameter of the particles 20b.

Here, in the barrier film 10 according to the embodiment of the present invention, it is preferable that the thickness of the OC layer 18 is larger than the thickness of the HC layer 20.

In the barrier film 10, it is required for the HC layer 20 to have the highest hardness and the pencil hardness of the HC layer 20 is equal to or higher than the pencil hardness of the OC layer 18. Therefore, by setting the thickness of the HC layer 20 having a high hardness to be smaller than the thickness of the OC layer 18, the curling of the barrier film 10 can be more suitably suppressed.

The HC layer 20 is a layer formed by dispersing the particles 20b, which become a lubricant, in the binder 20a formed of an organic compound (organic substance).

The binder 20a can be formed using various known organic compounds as long as the above-mentioned pencil hardness and the like can be realized. As the material for forming the binder 20a, for example, layers formed of various organic compounds exemplified in the description of the base organic layer 14, layers including organic compound layers exemplified in the description of the OC layer 18, and the like may be exemplified. Alternatively, one or more of the trifunctional or higher functional (meth)acrylate monomer and/or the (meth)acrylate polymer used together with the graft copolymer in the OC layer 18, exemplified for the OC layer 18, may be used to form the HC layer 20.

Preferably, the binder 20a is preferably formed of a polymer of a (meth)acrylate polymer, a polymer of a (meth)acrylate monomer, and a polymer of the (meth)acrylate polymer and the (meth)acrylate monomer.

More specifically, the HC layer 20 is preferably formed by applying a polymerizable composition (coating composition) containing a (meth)acrylate polymer, a (meth)acrylate monomer, and the particles 20b to the base material 12, drying the polymerizable composition, and polymerizing (curing) the polymerizable composition.

As the (meth)acrylate polymer, various known (meth)acrylate polymers can be used. As an example, (meth)acrylate polymers exemplified with the graft copolymer and the like as the material for forming the OC layer 18 are exemplified.

Among these, the (meth)acrylate polymers are preferably ultraviolet curable (meth)acrylate polymers, and among these, ultraviolet curable urethane acrylate polymers are preferable. Among these, particularly, an ultraviolet curable urethane acrylate polymer having a plurality of (meth)acryloyl groups at the terminal and having a plurality of side chains with a plurality of (meth)acryloyl groups at the terminal is preferably used.

Commercially available products of the urethane acrylate polymer can also be suitably used. Examples of the commercially available products include ACRIT 8 UX series manufactured by Taisei Fine Chemical Co., Ltd.

As the (meth)acrylate monomer, various known (meth)acrylate monomers can be used. As an example, various acrylate monomers exemplified in the description of the base organic layer 14 and trifunctional or higher functional (meth)acrylate monomers exemplified in the description of the OC layer 18 are exemplified.

Among these, a bifunctional or higher functional (meth)acrylate monomer, such as DPGDA, TMPTA, or DPHA, is particularly preferably used.

The HC layer 20 has a configuration formed by dispersing the particles 20b, which become a lubricant, in the binder 20a. By the HC layer 20 containing the particles 20b, winding and unwinding in a case of using R to R can be stably and smoothly performed and the shape of winding of the roll is excellent.

As the particles 20b, which become a lubricant, various known particles can be used as long as the particle diameter is smaller than the thickness of the OC layer 18. The particle diameter of the particles 20b is preferably 0.4 to 1.8 µm.

Specifically, various known particles used as a lubricant (matting agent) such as methyl (meth)acrylate polymer, butyl (meth)acrylate polymer, oleic acid amide, silicon oxide particles, or the like can be used. Among these, PMMA is suitably used in terms of good optical properties, appropriate hardness, and the like.

In addition, as the particles 20b, which become a lubricant, commercially available products can also be suitably used. Examples of commercially available products of the particles 20b include MX series manufactured by Soken Chemical & Engineering Co., Ltd. and the like.

It is preferable that the refractive index of the binder 20a is close to the refractive index of the particles 20b from the viewpoint that the HC layer 20 (barrier film 10) with higher transparency can be formed.

Specifically, a difference in refractive index between the binder 20a and the particles 20b is preferably 0.04 or less and more preferably 0.02 or less.

In the HC layer 20, the content of the particles 20b may be appropriately set according to the particles 20b to be used.

For example, the content of the particles 20b in the HC layer 20 is preferably 0.1% to 3% by mass and more preferably 0.5% to 1.5% by mass. That is, in the polymerizable composition forming the HC layer 20 described later, the content of the particles 20b with respect to the polymerizable components is preferably 0.1% to 3% by mass.

It is preferable to set the content of the particles 20b in the HC layer 20 to 0.1% by mass or more from the viewpoint that winding and unwinding can be stably and smoothly performed in a case of using R to R by imparting sufficient slidability to the HC layer 20, and the shape of winding of the roll is excellent.

It is preferable to set the content of the particles 20b in the HC layer 20 to 3% by mass or less from the viewpoint that a barrier film 10 having high total light transmittance and low haze can be obtained by improving the optical properties of the HC layer 20.

The HC layer 20 may be formed by a known method. Specifically, a coating method in which a polymerizable composition for forming the HC layer 20 is prepared by dissolving or dispersing an organic compound, which is the binder 20a, and the particles 20b in a solvent, this polymerizable composition is applied to the base material 12 and dried, and then the polymerizable composition is cured is preferable. In addition, it is preferable that the HC layer 20 is also formed by R to R.

For example, it is preferable to form the HC layer 20 by preparing a polymerizable composition for forming the HC layer 20 by dissolving or dispersing a (meth)acrylate polymer, and a (meth)acrylate monomer in a solvent and further adding and dispersing the particles 20b therein, applying this polymerizable composition to the surface of the base material 12 opposite to the surface on which the gas barrier layer is formed, drying the polymerizable composition, and then irradiating the polymerizable composition with ultraviolet rays to polymerize (cure) the polymerizable composition. As the solvent, a solvent in which each component can be dissolved or dispersed can be appropriately selected and used.

Here, in the polymerizable composition for forming the HC layer 20, the content of the (meth)acrylate polymer is preferably 20% to 60% by mass and more preferably 25% to 55% by mass with respect to the polymerizable components.

In addition, in the polymerizable composition for forming the HC layer 20, the content of the (meth)acrylate monomer is preferably 40% to 80% by mass and more preferably 45% to 75% by mass with respect to the polymerizable components.

In the polymerizable composition for forming the HC layer 20, it is preferable to set the contents of the (meth)acrylate polymer and the (meth)acrylate monomer to be in the above ranges from the viewpoint that an HC layer 20 having appropriate hardness can be formed and the degree of polymerization of the (meth)acrylate polymer can be improved.

In the polymerizable composition for forming the HC layer 20, as required, a photopolymerization initiator may be added. As the photopolymerization initiator, various known photopolymerization initiators can be used according to the component contained in the polymerizable composition. Specifically, various photopolymerization initiators exemplified in the description of the OC layer 18 are exemplified.

In addition, the amount of the photopolymerization initiator added may be appropriately set according to the photopolymerization initiator to be used. Specifically, the amount of the photopolymerization initiator added is preferably 0.5% to 5% by mass and more preferably 1% to 3% by mass with respect to the polymerizable components in the polymerizable composition. The polymerizable components refer to, in a case of the polymerizable composition for forming the HC layer 20, the (meth)acrylate polymer and the (meth)acrylate monomer.

For example, in OPV, the barrier films 10 according to the embodiment of the present invention are used for preventing deterioration of the OPV element by moisture by sandwiching the OPV element between the barrier films. The barrier films 10 are generally pressure-sensitively attached with the OC layer 18 facing the OPV element using a pressure sensitive adhesive such as a transparent pressure sensitive adhesive, a transparent pressure sensitive sheet, or an optical clear adhesive (OCA).

Accordingly, the barrier film 10 according to the embodiment of the present invention preferably has high light transmittance and low haze. Specifically, the total light transmittance of the barrier film 10 according to the embodiment of the present invention is preferably 85% or more and more preferably 88% or more. In addition, the haze of the barrier film 10 according to the embodiment of the present invention is preferably 3% or less and more preferably 1% or less.

The haze may be measured according to JIS K 7136 using a commercially available measuring device such as NDH5000 manufactured by Nippon Denshoku Industries Co., Ltd.

Hereinafter, an example of a method of producing the gas barrier film according to the embodiment of the present invention will be described with reference to conceptual diagrams of FIGS. 2 and 3.

Figure 2:
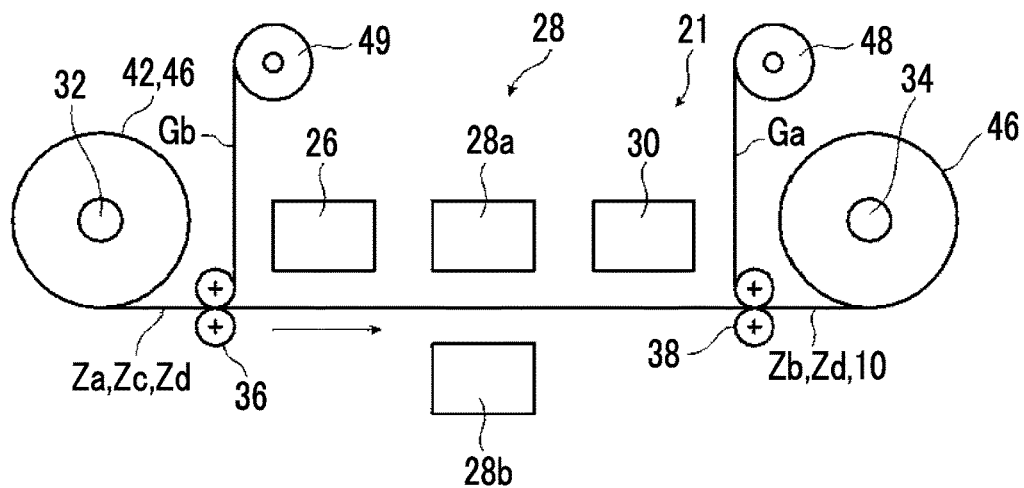
FIG. 2 is a diagram conceptually showing an example of an organic film forming apparatus for producing the gas barrier film according to the present invention.

The apparatus shown in FIG. 2 is an organic film forming apparatus 21. The organic film forming apparatus 21 is an apparatus for forming the base organic layer 14, the overcoat layer 18, and the hardcoat layer 20 by R to R, and forms the base organic layer 14, the OC layer 18, or the HC layer 20 by, while transporting a long base material Za in a longitudinal direction, applying and drying a composition, and then polymerizing (curing) a polymerizable component included in the composition by light irradiation.

The organic film forming apparatus 21 in the example shown in the drawing has, for example, an application unit 26, a drying unit 28, a light irradiation unit 30, a rotary shaft 32, a winding shaft 34, and a pair of transport rollers 36 and 38.

Figure 3:
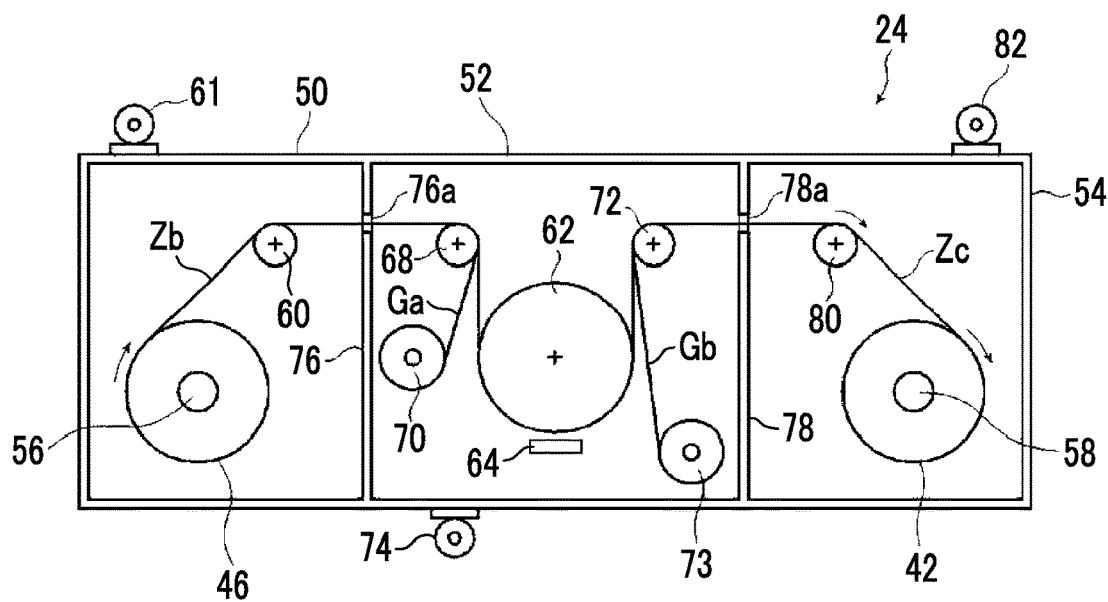
FIG. 3 is a diagram conceptually showing an example of an inorganic film forming apparatus for producing the gas barrier film according to the present invention.

On the other hand, the apparatus shown in FIG. 3 is an inorganic film forming apparatus 24 for forming the inorganic layer 16. The inorganic film forming apparatus 24 is also an apparatus for forming the inorganic layer 16 by R to R, and forms the inorganic layer 16 on the base organic layer 14 of a base material Zb while transporting the base material Zb on which the base organic layer 14 is formed (hereinafter, simply referred to as "base material Zb") in a longitudinal direction.

The inorganic film forming apparatus 24 in the example shown in the drawing has a feed chamber 50, a film forming chamber 52, and a winding chamber 54. The feed chamber 50 and the film forming chamber 52 are separated from each other by a partition wall 76 having an opening 76a and the film forming chamber 52 and the winding chamber 54 are separated from each other by a partition wall 78 having an opening 78a, respectively.

In a case where the barrier film 10 is prepared, first, a base material roll formed by winding a long base material Za (base material 12) is loaded on the rotary shaft 32 as a material roll 42, and the base organic layer 14 is formed on one surface of the base material 12.

In a case where the material roll 42 is loaded on the rotary shaft 32, the base material 12 is drawn from the material roll 42, passes through the application unit 26, the drying unit 28, and the light irradiation unit 30 through the pair of transport rollers 36 and passes through a predetermined transport path to the winding shaft 34 through the pair of transport rollers 38.

The base material Za drawn from the material roll 42 is transported to the application unit 26 by the pair of transport rollers 36 and a polymerizable composition for forming the base organic layer 14 is applied to one surface.

The polymerizable composition for forming the base organic layer 14 includes an organic solvent, an organic compound which is the base organic layer 14 (monomer, dimer, trimer, oligomer, polymer and the like), a surfactant, a silane coupling agent, and the like.

The composition can be applied in the application unit 26 by various known methods such as a die coating method, a dip coating method, an air knife method, a curtain coating method, a roller coating method, a wire bar coating method, and a gravure coating method.

The base material Za to which the polymerizable composition for forming the base organic layer 14 is applied is then heated by the drying unit 28 and the polymerizable composition from which the organic solvent is removed is dried.

The drying unit 28 has a drying unit 28a that performs drying by heating the material from the front surface side (the surface to which the composition is applied), and a drying unit 28b that performs drying by heating the material from the rear surface side (base material 12 side), and dries the composition from both the front surface side and the rear surface side.

The heating in the drying unit 28 may be performed by a known method of heating a sheet-like material. For example, the drying unit 28a on the front surface side is a drying unit using warm air and the drying unit 28b on the rear surface side has a heat roller (pass roller with a heating mechanism).

The base material Za on which the polymerizable composition for forming the base organic layer 14 is dried is then irradiated with ultraviolet rays or the like by the light irradiation unit 30, and the polymerizable component is polymerized (crosslinked) and cured to form the base organic layer 14.

As required, the organic compound which is the base organic layer 14 or the OC layer 18 may be cured in an inert gas atmosphere such as a nitrogen atmosphere. Further, as required, the base material Za may be heated at the time of curing by the light irradiation unit 30. Regarding this point, the same is applied to the formation of the OC layer 18 and the HC layer 20 which will be described later.

The base material 12 passing through the light irradiation unit 30 is transported by the pair of transport rollers 38 and is wound in a roll shape by the winding shaft 34 to obtain the base material Zb on which the base organic layer 14 is formed. Here, in the organic film forming apparatus 21, a protective film Ga drawn from a feed roll 48 is laminated on the base organic layer 14 on the pair of transport rollers 38 to protect the base organic layer 14.

In a case where the formation of the base organic layer 14 having a predetermined length is completed, as required, the base material 12 is cut and then a material roll 46 formed by winding the base material Zb on which the base organic layer 14 is formed is fed to the inorganic film forming apparatus 24 shown in FIG. 3 to form the inorganic layer 16.

In the inorganic film forming apparatus 24, the material roll 46 is loaded on the rotary shaft 56 of the feed chamber 50.

In a case where the material roll 46 is loaded on the rotary shaft 56, the base material Zb is drawn and then passes through a predetermined transport path from the feed chamber 50 to the winding shaft 58 of the winding chamber 54 through the film forming chamber 52.

After the base material Zb passes through the predetermined transport path, vacuum evacuation means 61 of the feed chamber 50, vacuum evacuation means 74 of the film forming chamber 52, and vacuum evacuation means 82 of the winding chamber 54 are driven and the pressure in the inorganic film forming apparatus 24 is set to a predetermined pressure.

The base material Zb drawn from the material roll 46 is guided by a pass roller 60 and transported to the film forming chamber 52.

The base material Zb transported to the film forming chamber 52 is guided by a pass roller 68 and wound around a drum 62. While the base material is supported on the drum 62 and transported along the predetermined path, the inorganic layer 16 is formed by, for example, CCP-CVD by film forming means 64. In a case where the inorganic layer 16 is formed, before the formation of the inorganic layer 16, the protective film Ga laminated on the base organic layer 14 is peeled off on the pass roller 68 and is collected by a collecting roll 70.

The inorganic layer 16 may be formed by a film formation method using a known vapor phase deposition method such as plasma CVD such as CCP-CVD or ICP-CVD, sputtering such as magnetron sputtering or reactive sputtering, or vacuum evaporation according to the inorganic layer 16 to be formed, as described above. Therefore, the process gas to be used, film formation conditions, and the like may be set and selected as appropriate according to the inorganic layer 16 to be formed, the thickness and the like.

The base material Zb on which the inorganic layer 16 is formed is guided by a pass roller 72 and transported to the winding chamber 54. Here, in the inorganic film forming apparatus 24, a protective film Gb drawing from a feed roll 73 is laminated on the inorganic layer 16 on the pass roller 72 to protect the inorganic layer 16.

In a case where the formation of the inorganic layer 16 is completed, cleaned dry air is introduced into all the chambers of the inorganic film forming apparatus 24 and the chambers are open to the atmosphere. Then, as required, the base material 12 is cut, the material roll 42 formed by winding a base material Zc on which the inorganic layer 16 is formed (hereinafter, also simply referred to as "base material Zc") is obtained and removed from the winding chamber 54 of the inorganic film forming apparatus 24.

In a case where a plurality of combinations of the base organic layer 14 and the inorganic layer 16 are formed, the formation of the base organic layer 14 and the inorganic layer 16 may be repeated multiple times.

The material roll 42 formed by winding the base material Zc on which the inorganic layer 16 is formed (the base material 12 on which the base organic layer 14 and the inorganic layer 16 are formed) is fed to the organic film forming apparatus 21 again to form the OC layer 18.

The material roll 42 formed by winding the base material Zc is loaded on the rotary shaft 32, and the base material Zc is drawn and is caused to pass through a predetermined transport path to the winding shaft 34 in the same manner as in the formation of the base organic layer 14 above.

Similar to the formation of the base organic layer 14, in the organic film forming apparatus 21, while the base material Zc (the base material 12 on which the base organic layer 14 and the inorganic layer 16 are formed) is transported in the longitudinal direction, in the application unit 26, the composition for forming the OC layer 18 is applied to the inorganic layer 16. In a case where the OC layer 18 (base organic layer 14) is formed on the inorganic layer 16, before application of the polymerizable composition, the protective film Gb laminated on the inorganic layer 16 is peed off on the pair of transport rollers 36 and is collected by a collecting roll 49.

The polymerizable composition for forming the OC layer 18 can be prepared by, for example, in a case of using a graft copolymer, dissolving or dispersing a graft copolymer, a trifunctional or higher (meth)acrylate monomer, a (meth)acrylate polymer, and a silane coupling agent having one or more (meth)acryloyl group in a solvent.

The polymerizable composition is a polymerizable composition with which an OC layer 18 having a pencil hardness of HB to 3H can be formed.

The coating amount of the polymerizable composition in the application unit 26 is set such that the thickness of the OC layer 18 to be formed is larger than the particle diameter of the particles of the HC layer 20 to be formed later. Further, since the thickness of the OC layer 18 is preferably 2 to 15 m, it is preferable that the coating amount of the polymerizable composition in the application unit 26 is adjusted such that the thickness of the OC layer 18 to be formed is set to be in this range.

The base material Zc on which the polymerizable composition for forming the OC layer 18 is applied is heated by the drying unit 28 and the then polymerizable composition from which the organic solvent is removed is dried in the same manner as in the formation of the base organic layer 14.

The base material Zc on which the polymerizable composition for forming the OC layer 18 is dried is then irradiated with ultraviolet rays by the light irradiation unit 30, and the organic compound is polymerized (crosslinked) and cured to form the OC layer 18. Here, in the light irradiation unit 30, the irradiation dose of ultraviolet rays is controlled such that the pencil hardness of the OC layer 18 is HB to 3H.

The base material Zc is wound in a roll shape by the winding shaft 34 and thus a base material Zd on which the OC layer 18 is formed is obtained.

The material roll 46 formed by winding the base material Zd on which the OC layer 18 is formed (base material 12 in which the base organic layer 14, the inorganic layer 16, and the OC layer 18 are formed, hereinafter, also simply referred to as "base material Zd") is removed from the organic film forming apparatus 21 and fed to the organic film forming apparatus 21 again to form the HC layer 20.

The material roll 46 formed by winding the base material Zd is loaded on the rotary shaft 32, and the base material Zd is drawn and is caused to pass through a predetermined transport path to the winding shaft 34 in the same manner as in the formation of the base organic layer 14 and the OC layer 18 above.

Here, the material roll 42 formed by winding the base material Zd is loaded on the rotary shaft 32 and is caused to pass through a predetermined transport path to the winding shaft 34 such that the surface on which the HC layer 20 is formed is the surface of the base material 12 opposite to the surface on which the OC layer 18 or the like is formed. In the following description, the surface of the base material 12 opposite to the surface on which the OC layer 18 or the like is formed, that is, the surface on which the HC layer 20 of the base material 12 is formed is also referred to as the opposite surface of the base material 12.

Similar to the formation of the base organic layer 14, in the organic film forming apparatus 21, while the base material Zd (the base material 12 on which the base organic layer 14, the inorganic layer 16, and the OC layer 18 are formed) is transported in the longitudinal direction, in the application unit 26, the composition for forming the HC layer 20 is applied to the opposite surface of the base material 12.

The composition for forming the HC layer 20 is obtained by dissolving or dispersing an organic compound which is the binder 20a and the particles 20b in a solvent. For example, as long as the binder 20a is the HC layer 20 having the polymer of the above-described (meth)acrylate polymer or the like, the polymerizable composition is obtained by dissolving or dispersing a (meth)acrylate polymer and a (meth)acrylate monomer in a solvent and further adding and dispersing the particles 20b therein.

The particle diameter of the particles 20b included in the polymerizable composition is smaller than the thickness of the is smaller than the thickness of the OC layer 18 formed above. The particle diameter of the particles 20b is preferably 0.4 to 1.8 μm and further, the particles 20b are preferably particles including PMMA as described above.

The polymerizable composition is capable of forming the HC layer 20 having a pencil hardness equal to or higher than the pencil hardness of the OC layer 18, and a difference in pencil hardness with the OC layer 18 being within 2 grades.

Since the thickness of the HC layer 20 is preferably 2 to 7 μm, in the application unit 26, the coating amount of the polymerizable composition is preferably adjusted such that the thickness of the HC layer 20 to be formed is in the above range. In addition, the thickness of the HC layer 20 is preferably smaller than the thickness of the OC layer 18, as described above.

The base material Zd on which the composition for forming the HC layer 20 is applied is then heated by the drying unit 28 and the polymerizable composition from which the organic solvent is removed is dried in the same manner as in the formation of the base organic layer 14.

The base material Zd on which the composition for forming the HC layer 20 is dried is then irradiated with ultraviolet rays or the like by the light irradiation unit 30, the organic compound (graft copolymer and acrylate monomer, which is the binder 20a, is polymerized (crosslinked) and cured to form the HC layer 20. Here, the irradiation dose of ultraviolet rays or the like is controlled in the light irradiation unit 30 such that the pencil hardness of the HC layer 20 is equal to or higher than the pencil hardness of the OC layer 18 and a difference between the pencil hardness of the HC layer and the pencil hardness of the OC layer 18 is 2 grades or less.

The base material Zd on which the HC layer 20 is formed, that is, the barrier film 10 is wounded in a roll shape by the winding shaft 34.

In the production method according to the embodiment of the present invention, as described above, after the inorganic layer 16 (all inorganic layers 16 of the gas barrier layer) is formed, the HC layer 20 is formed. In other words, before the HC layer 20 is formed, all the inorganic layers 16 are formed.

The inorganic layer 16 is preferably formed by R to R. In addition, in order to form an appropriate inorganic layer 16, it is preferable that the base material Zb is wound on the drum 62 and while being supported on the drum 62, the inorganic layer 16 is formed by plasma CVD. On the other hand, the HC layer 20 contains the particles 20b and has unevenness due to the particles 20b on the surface.

Therefore, in a case where the inorganic layer 16 is formed after the HC layer 20 is formed, unevenness occurs on the surface of the base organic layer 14 which is the formation surface of the inorganic layer 16, the charge and the plasma become nonuniform, and thus a nonuniform inorganic layer 16 is formed.

In contrast, by forming the inorganic layer 16 before forming the HC layer 20, the smooth opposite surface of the base material 12 is brought into contact with the drum 62 and while supporting the base material 12, the base material can be transported. Thus, a uniform inorganic layer 16 having good properties can be formed on the smooth base organic layer 14 by uniform charge and plasma.

In the above example, the HC layer 20 is formed after the OC layer 18 is formed, but the production method according to the embodiment of the present invention is not limited thereto.

After the inorganic layer 16 is formed, the protective film Gb is laminated on the inorganic layer 16 to protect the inorganic layer 16. Therefore, after the inorganic layer 16 is formed and before the OC layer 18 is formed, the HC layer 20 may be formed on the opposite surface of the base material 12 and then the OC layer may be formed on the inorganic layer 16.

However, considering prevention of the damage of the inorganic layer 16 and the like, it is preferable to form the HC layer 20 on the opposite surface of the base material 12 after forming the OC layer 18, that is, after forming the gas barrier layer.

The gas barrier film and the method of producing the gas barrier film according to the embodiments of the present invention have been described above in detail but the present invention is not limited to the above examples. It should be understood that various improvements and modifications may, of course, be made within a range not departing from the scope of the present invention.

EXAMPLES

Hereinafter, the present invention will be more specifically described using specific examples of the present invention.

Example 1

<Base Material>
A PET film (COSMO SHINE A4300 manufactured by Toyobo Co., Ltd.) having a width of 1000 mm, a thickness of 100 µm, and a length of 100 m was used as a base material 12.

<Formation of Base Organic Layer 14>
TMPTA (manufactured by Daicel-Cytec Company, Ltd.) and a photopolymerization initiator (ESACURE KTO 46, manufactured by Lamberti S. p.) were prepared and weighed such that the mass ratio was 95:5. These materials were dissolved in methyl ethyl ketone (MEK) such that the solid content concentration was 15% by mass, and a polymerizable composition for forming the base organic layer 14 was prepared.

The polymerizable composition for forming the base organic layer 14 was charged at a predetermined position of the application unit 26 of the organic film forming apparatus 21 by R to R shown in FIG. 2. In addition, the material roll 42 formed by winding the base material 12 in a roll shape was loaded on the rotary shaft 32 and the base material 12 (base material Za) was inserted into a predetermined transport path. Further, the feed roll 48 around which the protective film Ga formed of PE was wound was loaded at the predetermined position and laminated on the base organic layer 14 on the pair of transport rollers 38.

In the organic film forming apparatus 21, while the base material 12 was transported in the longitudinal direction, the polymerizable composition was applied by the application unit 26 and the polymerizable composition was dried in the drying unit 28. The application unit 26 adopted a die coater. The heating temperature in the drying unit 28 was set to 50° C. and the passing time was set to 3 minutes.

Thereafter, while heating the polymerizable composition to 80° C. from the opposite surface, the polymerizable composition was irradiated with ultraviolet rays (cumulative irradiation dose: about 600 mJ/cm$^2$) in the light irradiation unit 30 and the polymerizable composition was cured to form the base organic layer 14. On the pair of transport rollers 38, the protective film Ga was laminated on the surface of the base organic layer 14 and then the laminate was wound and used as the material roll 46 formed by winding the base material 12 on which the base organic layer 14 was formed (base material Zb). The thickness of the base organic layer 14 was 2 µm.

<Formation of Inorganic Layer 16>
The material roll 46 formed by winding the base material 12 on which the base organic layer 14 was formed (base material Zb) was loaded on the rotary shaft 56 of the feed chamber 50 of the inorganic film forming apparatus 24 for performing film formation by capacitive coupling type plasma (CVD CCP-CVD) shown in FIG. 3, and the base material Zb was inserted into a predetermined transport path. In addition, the feed roll 73 formed by winding the protective film Gb formed of PE was loaded at a predetermined position and was laminated on the inorganic layer 16 on the pass roller 72.

In the CVD film forming apparatus, while the base material 12 on which the base organic layer 14 was formed was transported in the longitudinal direction, the protective film Ga was peeled off by the pass roller 68 in the film forming chamber 52, and then a silicon nitride film was formed on the base organic layer 14 as the inorganic layer 16. Next, on the pass roller 72, the protective film Gb was laminated on the surface of the inorganic layer 16 and then the laminate was wound around the winding shaft 58 in the winding chamber 54. The base material 12 on which the base organic layer 14 and the inorganic layer 16 were formed (base material Zc) was wound and used as the material roll 42.

The raw material gases for forming the inorganic layer 16, silane gas (flow rate: 160 sccm), ammonia gas (flow rate: 370 sccm), hydrogen gas (flow rate: 590 sccm), and nitrogen gas (flow rate: 240 sccm) were used. As a power supply, a high-frequency power supply having a frequency of 13.56 MHz was used and the plasma excitation power was set to 800 W. The film forming pressure was set to 40 Pa. The thickness of the inorganic layer 16 was 30 nm.

<Formation of OC Layer 18>

As a graft copolymer, ACRIT 8BR-930, manufactured by Taisei Fine Chemical Co., Ltd., (UV curable urethane acrylic polymer having a weight-average molecular weight of 16000) was prepared.

DIANAL BR83 (PMMA having a weight-average molecular weight of 40000) manufactured by Mitsubishi Rayon Co., Ltd. was prepared as a (meth)acrylate polymer.

As a trifunctional or higher functional (meth)acrylate monomer, A-DPH (dipentaerythritol hexaacrylate (DPHA)) manufactured by Shin-Nakamura Chemical Co. Ltd. was prepared.

KBM 5103 manufactured by Shin-Etsu Silicone Co., Ltd. was prepared as a silane coupling agent having one or more (meth)acryloyl groups.

Further, ESACURE KTO 46 manufactured by Lamberti S.p. was prepared as a photopolymerization initiator.

These materials were weighed such that the mass ratio of graft copolymer:PMMA:acrylate monomer:silane coupling agent:photopolymerization initiator was 35:22:30:10:3, and these materials were dissolved in MEK such that the solid content concentration was 30% by mass to prepare a polymerizable composition for forming the OC layer 18.

The polymerizable composition for forming the OC layer 18 was charged at a predetermined position of the application unit 26 of the organic film forming apparatus 21 by R to R shown in FIG. 2. In addition, the material roll 42 formed by winding the base material 12 on which the base organic layer 14 and the inorganic layer 16 were formed (base material Zc) was loaded on the rotary shaft 32 and the base material Zc was inserted into a predetermined transport path.

In the organic film forming apparatus 21, while the base material Zc was transported in the longitudinal direction, the protective film Gb was peeled off on the pair of transport rollers 36 and then the polymerizable composition was applied to the inorganic layer 16 by the application unit 26. The polymerizable composition was dried in the drying unit 28. The application unit 26 adopted a die coater. The heating temperature in the drying unit 28 was set to 130° C. and the passing time was set to 3 minutes.

Thereafter, while heating the polymerizable composition to 80° C. from the opposite surface, the polymerizable composition was irradiated with ultraviolet rays (cumulative irradiation dose: about 600 mJ/cm$^2$) in the light irradiation unit 30 and was cured to form the OC layer 18. The film was wound and used as the material roll 46 formed by winding the base material 12 on which the base organic layer 14, the inorganic layer 16, and the OC layer 18 were formed (base material Zd). The thickness of the OC layer 18 was 10 μm.

At the time of forming the OC layer 18, the water vapor transmission rate [g/(m$^2$·day)] of the base material Zd was measured by a calcium corrosion method (a method described in JP2005-283561A) under conditions of a temperature of 40° C. and a relative humidity of 90% RH.

As a result, the water vapor transmission rate of the base material Zd was 1.5×10$^{-4}$ g/(m$^2$·day).

<Formation of HC Layer 20>

As an ultraviolet curable urethane acrylate polymer, ACRIT 8UX-015A manufactured by Taisei Fine Chemical Co., Ltd. was prepared.

As a (meth)acrylate monomer, A-DPH (dipentaerythritol hexaacrylate (DPHA)) manufactured by Shin-Nakamura Chemical Co. Ltd. was prepared.

MX-150 (PMMA particles having an average particle diameter of 1.5 μm) manufactured by Soken Chemical & Engineering Co. Ltd. was prepared as particles 20b.

Further, ESACURE KTO 46 manufactured by Lamberti S. p. was prepared as a photopolymerization initiator.

These materials were weighed such that the mass ratio of urethane acrylate polymer:(meth)acrylate monomer:particles 20b:photopolymerization initiator was 38:58:1:3, and these materials were dissolved in a mixed solvent of MEK and propylene glycol monomethyl ether acetate (PGMEA) such that the solid content concentration was 45% by mass to prepare a polymerizable composition for forming the HC layer 20.

The polymerizable composition for forming the HC layer 20 was charged at a predetermined position of the application unit 26 of the organic film forming apparatus 21 by R to R shown in FIG. 2.

In addition, the material roll 46 formed by winding the base material 12 on which the base organic layer 14, the inorganic layer 16, and the OC layer 18 were formed (base material Zd) was loaded on the rotary shaft 32 and the base material Zd was inserted into a predetermined transport path. The loading of the material roll 46 and the insertion of the base material Zd were performed such that the surface of the base material 12 opposite to the surface on which the OC layer 18 and the like were formed, that is, the opposite surface of the base material 12 became a deposition surface.

In the organic film forming apparatus 21, while the base material Zd was transported in the longitudinal direction, the polymerizable composition was applied to the opposite surface of the base material 12 by the application unit 26, and the polymerizable composition was dried in the drying unit 28. The application unit 26 adopted a die coater. The heating temperature in the drying unit 28 was set to 100° C. and the passing time was set to 3 minutes.

Thereafter, while heating the polymerizable composition to 80° C. from the rear surface, the base material Zd was irradiated with ultraviolet rays (cumulative irradiation dose: about 600 mJ/cm$^2$) in the light irradiation unit 30 and the polymerizable composition was cured to form the OC layer 18. Thus, a gas barrier film 10 was prepared. The thickness of the HC layer 20 was 5 μm.

The pencil hardness of the OC layer 18 and the HC layer 20 was measured according to JIS K 5600-5-4. As a result, the pencil hardness of the OC layer 18 and the pencil hardness of the HC layer 20 were both 2H.

In the following examples, the pencil hardness was measured in the same manner as in this example.

Example 2

As the particles 20b of the HC layer 20, MX-40T (PMMA particles having an average particle diameter of 0.4 μm) manufactured by Soken Chemical & Engineering Co., Ltd. was prepared. A polymerizable composition for forming the HC layer 20 was prepared in the same manner as in Example 1 except that these particles 20b were used.

A barrier film 10 was prepared in the same manner as in Example 1 except that this polymerizable composition was used to form the HC layer 20.

Example 3

As the particles 20b of the HC layer 20, MX-180TA (PMMA particles having an average particle diameter of 1.8 μm) manufactured by Soken Chemical & Engineering Co., Ltd. was prepared. A polymerizable composition for forming the HC layer 20 was prepared in the same manner as in Example 1 except that these particles 20b were used.

A barrier film 10 was prepared in the same manner as in Example 1 except that this polymerizable composition was used to form the HC layer 20.

Example 4

As the particles 20b of the HC layer 20, MX-500 (PMMA particles having an average particle diameter of 5 μm) manufactured by Soken Chemical & Engineering Co., Ltd. was prepared. A polymerizable composition for forming the HC layer 20 was prepared in the same manner as in Example 1 except that these particles 20b were used.

A barrier film 10 was prepared in the same manner as in Example 1 except that this polymerizable composition was used to form the HC layer 20.

Example 5

A barrier film 10 was prepared in the same manner as in Example 1 except that in the formation of the OC layer 18, the coating amount of the polymerizable composition was changed and the thickness of the OC layer 18 was changed to 5 μm.

Example 6

A barrier film 10 was prepared in the same manner as in Example 1 except that in the formation of the OC layer 18, the coating amount of the polymerizable composition was changed and the thickness of the OC layer 18 was changed to 2 μm.

Example 7

A barrier film 10 was prepared in the same manner as in Example 1 except that in the formation of the OC layer 18, the coating amount of the polymerizable composition was changed and the thickness of the OC layer 18 was changed to 15 μm.

Example 8

A barrier film 10 was prepared in the same manner as in Example 1 except that in the formation of the OC layer 18, the irradiation dose of ultraviolet rays was changed to about ⅓, and the hardness of the OC layer 18 was changed, and in the formation of the HC layer 20, the irradiation dose of ultraviolet rays was changed to about ½, and the hardness of the HC layer 20 was changed.

The pencil hardness of the OC layer 18 was F and the pencil hardness of the formed HC layer 20 was H.

Example 9

A barrier film 10 was prepared in the same manner as in Example 1 except that in the formation of the OC layer 18, the irradiation dose of ultraviolet rays was changed to about ½, and the hardness of the OC layer 18 was changed, and in the formation of the HC layer 20, the irradiation dose of ultraviolet rays was changed to about twice, and the hardness of the HC layer 20 was changed.

The pencil hardness of the OC layer 18 was H and the pencil hardness of the formed HC layer 20 was 3H.

Example 10

A barrier film 10 was prepared in the same manner as in Example 1 except that in the formation of the inorganic layer 16, under the same film formation conditions, the transport rate of the base material Zb was changed to twice, and the thickness of the inorganic layer 16 was changed to 15 μm.

Example 11

A barrier film 10 was prepared in the same manner as in Example 1 except that in the formation of the inorganic layer 16, under the same film formation conditions, the transport rate of the base material Zb was changed to ⅓, and the thickness of the inorganic layer 16 was changed to 75 μm.

Example 12

A barrier film 10 was prepared in the same manner as in Example 1 except that in the formation of the HC layer 20, the coating amount of the polymerizable composition was changed and the thickness of the HC layer 20 was changed to 2 μm.

Example 13

A barrier film 10 was prepared in the same manner as in Example 1 except that in the formation of the HC layer 20, the coating amount of the polymerizable composition was changed and the thickness of the HC layer 20 was changed to 7 μm.

Example 14

A polymerizable composition for forming the HC layer 20 was prepared in the same manner as in Example 1 except that in the preparation of the polymerizable composition for forming the HC layer 20, without using ACRIT 8UX-015A as the urethane acrylate polymer, the mass ratio of the components was set such that the mass ratio of (meth)acrylate monomer:particles 20b:photopolymerization initiator was 96:1:3.

A barrier film 10 was prepared in the same manner as in Example 1 except that this polymerizable composition was used to form the HC layer 20.

Example 15

As the particles 20b of the HC layer 20, TOSPEARL 200 (silicone particles having an average particle diameter of 2 μm) manufactured by Momentive Performance Materials Co., Inc. was prepared. A polymerizable composition for forming the HC layer 20 was prepared in the same manner as in Example 1 except that these particles 20b were used.

A barrier film 10 was prepared in the same manner as in Example 1 except that this polymerizable composition was used to form the HC layer 20.

Example 16

As an ultraviolet curable urethane acrylate polymer, ACRIT 8BR-930 manufactured by Taisei Fine Chemical Co., Ltd. was prepared.

As a urethane polymer, BYRON U1410 manufactured by Toyobo Co., Ltd. was prepared.

MX-150 (PMMA particles having an average particle diameter of 1.5 m) manufactured by Soken Chemical & Engineering Co. Ltd. was prepared as the particles 20b.

Further, IRGACURE 184 commercially available from BASF was prepared as a photopolymerization initiator.

These materials were weighed such that the mass ratio of urethane acrylate polymer:urethane polymer:particles 20b:photopolymerization initiator was 70:24:1:5, and these materials were dissolved in a mixed solvent of MEK and propylene glycol monomethyl ether acetate (PGMEA) to prepare a polymerizable composition with a solid content concentration of 45% by mass.

A barrier film 10 was prepared in the same manner as in Example 1 except that this polymerizable composition was used and the heating temperature in a case of curing the polymerizable composition was set to 60° C. to form the OC layer 18 and the HC layer 20. In the polymerizable composition of the OC layer 18, the particles 20b were not used, and instead, the mass ratio of urethane polymer was 25.

The pencil hardness of the OC layer 18 and the pencil hardness of the HC layer 20 were both F.

Example 17

A barrier film 10 was prepared in the same manner as in Example 1 except that in the formation of the OC layer 18 and the HC layer 20, the coating amount of the polymerizable composition was changed and the thickness of the OC layer 18 and the thickness of the HC layer 20 were respectively changed to 5 μm and 7 μm.

Example 18

A barrier film 10 was prepared in the same manner as in Example 1 except that before the OC layer 18 was formed, two combinations of the base organic layer 14 and the inorganic layer 16 were formed by repeatedly forming the base organic layer 14 and the inorganic layer 16, and further, in the formation of the HC layer 20, the coating amount of the polymerizable composition was changed, and the thickness of the HC layer 20 was changed to 2 μm.

Example 19

A barrier film 10 was prepared in the same manner as in Example 1 except that before the OC layer 18 was formed, three combinations of the base organic layer 14 and the inorganic layer 16 were formed by repeatedly forming the base organic layer 14 and the inorganic layer 16, and further, in the formation of the HC layer 20, the coating amount of the polymerizable composition was changed, and the thickness of the HC layer 20 was changed to 2 μm.

Comparative Example 1

A polymerizable composition for forming the HC layer 20 was prepared in the same manner as in Example 1 except that in the preparation of the polymerizable composition for forming the HC layer 20, without using the particles 20b, the mass ratio of the components were set such that the mass ratio of urethane acrylate polymer:(meth)acrylate monomer:photopolymerization initiator was 39:58:3.

A barrier film was prepared in the same manner as in Example 1 except that this polymerizable composition was used to form the HC layer 20.

Comparative Example 2

A gas barrier film was prepared in the same manner as in Example 1 except that in the formation of the OC layer 18, the coating amount of the polymerizable composition was changed and the thickness of the OC layer 18 was changed to 1 μm.

Comparative Example 3

As the particles 20b of the HC layer 20, MX-300 (PMMA particles having an average particle diameter of 3 μm) manufactured by Soken Chemical & Engineering Co. Ltd. was prepared. A polymerizable composition for forming the HC layer 20 was prepared in the same manner as in Example 1 except that these particles 20b were sued.

A barrier film was prepared in the same manner as in Example 1 except that this polymerizable composition was used to form the HC layer 20, and in the formation of the OC layer 18, the coating amount of the polymerizable composition was changed and the thickness of the OC layer 18 was changed to 2 μm.

Comparative Example 4

As an ultraviolet curable urethane acrylate polymer, ACRIT 8BR-930 manufactured by Taisei Fine Chemical Co., Ltd. was prepared.

As a urethane polymer, BYRON U1410 manufactured by Toyobo Co., Ltd. was prepared.

Further, IRGACURE 184 commercially available from BASF was prepared as a photopolymerization initiator.

These materials were weighed such that the mass ratio of urethane acrylate polymer:urethane polymer:photopolymerization initiator was 70:25:5, and these materials were dissolved in a mixed solvent of MEK and propylene glycol monomethyl ether acetate (PGMEA) such that the solid content concentration was 45% by mass to prepare a polymerizable composition for forming the OC layer 18.

In addition, a polymerizable composition for forming the HC layer 20 was prepared in the same manner as in Example 1 except that the mass ratio of urethane acrylate polymer:(meth)acrylate monomer:particles 20b:photopolymerization initiator was changed to 18:78:1:3.

A barrier film was prepared in the same manner as in Example 1 except that the polymerizable composition was used and the heating temperature in a case where the polymerizable composition was cured was set to 60° C. to form the OC layer 18, the polymerizable composition was used to form the HC layer 20, and the hardness of the OC layer 18 and the hardness of the HC layer 20 were changed.

The pencil hardness of the OC layer was F and the pencil hardness of the HC layer 20 was 3H.

Comparative Example 5

A barrier film 10 was prepared in the same manner as in Example 1 except that in the formation of the OC layer 18, the irradiation dose of ultraviolet rays was changed to about twice, and the hardness of the OC layer 18 was changed, and in the formation of the HC layer 20, the irradiation dose of ultraviolet rays was changed to about ⅓, and the hardness of the HC layer 20 was changed.

The pencil hardness of the OC layer was 3H and the pencil hardness of the HC layer 20 was H.

Comparative Example 6

A barrier film 10 was prepared in the same manner as in Example 1 except that in the formation of the OC layer 18, the irradiation dose of ultraviolet rays was changed to about ⅕ and the hardness of the OC layer 18 was changed.

The pencil hardness of the OC layer was B.

Comparative Example 7

A polymerizable composition for forming the OC layer 18 was prepared in the same manner as in Example 1 except that the mass ratio of graft copolymer:PMMA:acrylate monomer:silane coupling agent:photopolymerization initiator was changed to 32:22:30:10:6.

A barrier film 10 was prepared in the same manner as in Example 1 except that the polymerizable composition was used, further, the irradiation dose of ultraviolet rays was changed to about twice, and the hardness of the OC layer 18 was changed.

The pencil hardness of the OC layer was 4H.
[Evaluation]

With respect to the barrier films 10 produced in this manner, gas barrier properties, scratch resistance, shape of winding, curling, and adhesiveness were evaluated.

<Gas Barrier Properties>

The water vapor transmission rate (WVTR) [g/(m²·day)] was measured by a calcium corrosion method (a method described in JP2005-283561A) under conditions of a temperature of 40° C. and a relative humidity of 90% RH.

<Scratch Resistance>

The OC layer 18 was rubbed using a #0000 steel wool by 20 reciprocations while applying a load of 200 g/cm², and then the OC layer 18 was observed by visual observation and observation with a microscope to evaluate the scratch resistance. The evaluation is as shown below.

A: No scratches are observed in both visual observation and observation with a microscope.

B: Although no scratches are observed in visual observation, fine scratches are observed in observation with a microscope.

C: Fine scratches are observed in visual observation.

D: Scratches are clearly observed in visual observation.

<Shape of Winding>

The appearance of the shape of winding of the barrier films was evaluated. The evaluation is as shown below.

A: The film is uniformly wound.

B: The belt-like tightening part is slightly seen.

C: The belt-like tightening part is seen.

D: Partial unevenness is generated.

E: Unevenness is generated as a whole.

<Curling>

The sample was placed and punched out in a square shape with a side of 10 cm by a THOMSON blade, the distance (floating amount) from the installation surface to the four corners was measured, and the average value was calculated. The curling was evaluated from the average value obtained based on the following evaluation standards. Note that the measurement was performed by placing the sample with a strongly curled side up.

A: 1 mm or less

B: More than 1 mm and 3 mm or less

C: More than 3 mm and 5 mm or less

D: More than 5 mm and 7 mm or less

E: More than 7 mm

<Adhesiveness>

The adhesiveness between the inorganic layer 16 and the OC layer 18 was evaluated by a cross cut peeling test according to JIS K 5400.

Using a cutter knife, cuts having 90° with respect to the film surface were made at intervals of 1 mm on the formation surface of the OC layer 18 of each gas barrier film and 100 cross cuts with intervals of 1 mm were prepared. A 2 cm wide Mylar tape (manufactured by Nitto Denko Corporation, polyester tape No. 31B) attached to the film surface was peeled off. The adhesiveness was evaluated based on the number of grids in which the OC layer 18 remained (maximum 100).

The results are shown in the tables below.

TABLE 1

| | | Example 1 | Example 2 | Example 3 | Example 4 | Example 5 | Example 6 | Example 7 |
|---|---|---|---|---|---|---|---|---|
| OC layer | Thickness [μm] | 10 | 10 | 10 | 10 | 5 | 2 | 15 |
| | Pencil hardness | 2H | 2H | 2H | 2H | 2H | 2H | 2H |
| | Inorganic layer thickness [nm] | 30 | 30 | 30 | 30 | 30 | 30 | 30 |
| | Number of laminated organic and inorganic layers | 1 | 1 | 1 | 1 | 1 | 1 | 1 |
| HC layer | Thickness [μm] | 5 | 5 | 5 | 5 | 5 | 5 | 5 |
| | Pencil hardness | 2H | 2H | 2H | 2H | 2H | 2H | 2H |
| | Particle Material | PMMA | PMMA | PMMA | PMMA | PMMA | PMMA | PMMA |
| | Particle diameter [μm] | 1.5 | 0.4 | 1.8 | 5 | 1.5 | 1.5 | 1.5 |
| Evaluation | WVTR [g/(m²·day)] | $1.1 \times 10^{-4}$ | $1.0 \times 10^{-4}$ | $1.2 \times 10^{-4}$ | $2.2 \times 10^{-4}$ | $1.3 \times 10^{-4}$ | $2.3 \times 10^{-4}$ | $1.0 \times 10^{-4}$ |
| | Scratch resistance | B | A | B | C | B | B | B |
| | Shape of winding | B | C | A | A | B | B | B |
| | Curling | B | B | B | B | A | A | C |
| | Adhesiveness | 100 | 100 | 100 | 100 | 100 | 100 | 100 |

| | | Example 8 | Example 9 | Example 10 | Example 11 | Example 12 | Example 13 | Example 14 |
|---|---|---|---|---|---|---|---|---|
| OC layer | Thickness [μm] | 10 | 10 | 10 | 10 | 10 | 10 | 10 |
| | Pencil hardness | F | H | 2H | 2H | 2H | 2H | 2H |
| | Inorganic layer thickness [nm] | 30 | 30 | 15 | 75 | 30 | 30 | 30 |
| | Number of laminated organic and inorganic layers | 1 | 1 | 1 | 1 | 1 | 1 | 1 |
| HC layer | Thickness [μm] | 5 | 5 | 5 | 5 | 2 | 7 | 5 |
| | Pencil hardness | H | 3H | 2H | 2H | 2H | 2H | 2H |
| | Particle Material | PMMA | PMMA | PMMA | PMMA | PMMA | PMMA | PMMA |
| | Particle diameter [μm] | 1.5 | 1.5 | 1.5 | 1.5 | 1.5 | 1.5 | 1.5 |

TABLE 1-continued

| Evaluation | WVTR [g/(m² · day)] | $1.1 \times 10^{-4}$ | $3.1 \times 10^{-4}$ | $1.5 \times 10^{-4}$ | $1.0 \times 10^{-4}$ | $1.8 \times 10^{-4}$ | $1.1 \times 10^{-4}$ | $1.1 \times 10^{-4}$ |
|---|---|---|---|---|---|---|---|---|
| | Scratch resistance | A | C | B | B | C | A | B |
| | Shape of winding | B | B | B | B | A | C | B |
| | Curling | C | C | B | B | C | A | D |
| | Adhesiveness | 90 | 100 | 100 | 100 | 100 | 100 | 100 |

| | | Example 15 | Example 16 | Example 17 | Example 18 | Example 19 |
|---|---|---|---|---|---|---|
| OC layer | Thickness [μm] | 10 | 10 | 5 | 10 | 10 |
| | Pencil hardness | 2H | F | 2H | 2H | 2H |
| | Inorganic layer thickness [nm] | 30 | 30 | 30 | 30 | 30 |
| | Number of laminated organic and inorganic layers | 1 | 1 | 1 | 2 | 3 |
| HC layer | Thickness [μm] | 5 | 5 | 7 | 2 | 2 |
| | Pencil hardness | 2H | F | 2H | 2H | 2H |
| Particle | Material | Silicone | PMMA | PMMA | PMMA | PMMA |
| | Particle diameter [μm] | 2 | 1.5 | 1.5 | 1.5 | 1.5 |
| Evaluation | WVTR [g/(m² · day)] | $4.2 \times 10^{-4}$ | $4.5 \times 10^{-4}$ | $4.4 \times 10^{-4}$ | $3.1 \times 10^{-5}$ | $6.6 \times 10^{-6}$ |
| | Scratch resistance | C | C | B | B | B |
| | Shape of winding | B | B | C | B | B |
| | Curling | B | A | C | B | C |
| | Adhesiveness | 100 | 100 | 100 | 100 | 100 |

TABLE 2

| | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| OC layer | Thickness [μm] | 10 | 1 | 2 | 10 | 10 | 10 | 10 |
| | Pencil hardness | 2H | 2H | 2H | F | 3H | B | 4H |
| | Inorganic layer thickness [nm] | 30 | 30 | 30 | 30 | 30 | 30 | 30 |
| | Number of laminated organic and inorganic layers | 1 | 1 | 1 | 1 | 1 | 1 | 1 |
| HC layer | Thickness [μm] | 5 | 5 | 5 | 5 | 5 | 5 | 5 |
| | Pencil hardness | 2H | 2H | 2H | 3H | H | 2H | 2H |
| Particle | Material | — | PMMA | PMMA | PMMA | PMMA | PMMA | PMMA |
| | Particle diameter [μm] | — | 1.5 | 3 | 1.5 | 1.5 | 1.5 | 1.5 |
| Evaluation | WVTR [g/(m² · day)] | $1.1 \times 10^{-2}$ | $4.3 \times 10^{-3}$ | $5.1 \times 10^{-3}$ | $2.1 \times 10^{-3}$ | $1.5 \times 10^{-3}$ | $5.5 \times 10^{-3}$ | $3.5 \times 10^{-3}$ |
| | Scratch resistance | A | C | C | D | A | D | A |
| | Shape of winding | E | B | A | C | D | A | D |
| | Curling | B | B | B | D | D | C | D |
| | Adhesiveness | 100 | 100 | 100 | 100 | 90 | 100 | 30 |

In these Examples and Comparative Examples, all the base materials are PET films having a thickness of 100 μm, all the base organic layers 14 are layers formed of TMPTA and having a thickness of 2 μm, and all the inorganic layers 16 are silicon nitride films. In addition, the HC layer 20 of Example 14 has a composition in which urethane acrylate is removed from the HC layer 20 of Example 1.

As shown in the above tables, the barrier films 10 according to the embodiments of the present invention in which the particle diameter of the particles 20b included in the HC layer 20 is smaller than the thickness of the OC layer 18, the pencil hardness of the OC layer 18 is HB to 3H, a difference between the pencil hardness of the OC layer 18 and the pencil hardness of the HC layer 20 is within 2 grades, and the pencil hardness of the HC layer 20 is equal to or higher than the pencil hardness of the OC layer 18 have good gas barrier properties and good scratch resistance and shape of winding, exhibit less curling, and further, exhibit good adhesiveness between the OC layer 18 and the inorganic layer 16.

In contrast, the barrier films of Comparative Example 1 in which the HC layer 20 does not include particles cannot be wound in an appropriate roll shape by R to R, the shape of winding is very poor, the inorganic layer 16 is damaged by unevenness generated in the roll, and thus the gas barrier properties are low.

In a case where the barrier films of Comparative Example 2 and Comparative Example 3 in which the particle diameter of the particles 20b contained in the HC layer 20 is larger than the thickness of the OC layer 18 is wound into a roll, it is considered that the inorganic layer 16 is damaged by pressing due to the particles 20b and the unevenness of the HC layer 20 caused by the particles 20b, and compared to the barrier films according to the embodiments of the present invention, the gas barrier properties are low.

In the barrier film of Comparative Example 4 in which a difference between the pencil hardness of the OC layer 18 and the pencil hardness of the HC layer 20 is more than 2 grades, since the hardness difference between the OC layer 18 and the HC layer 20 is large, the OC layer 18 is damaged by contact with the HC layer 20 in a case of winding. A result, the inorganic layer 16 is damaged to exhibit low gas barrier properties, the degree of curling is large, and the scratch resistance is also low.

In the barrier film of Comparative Example 5 in which the pencil hardness of the OC layer 18 is higher than the pencil hardness of the HC layer 20, the degree of curling is large, the shape of winding is very poor, the inorganic layer 16 is damaged by unevenness generated in the roll, and thus the gas barrier properties are low.

In the barrier film of Comparative Example 6 in which the pencil hardness of the OC layer 18 is B, the OC layer 18 cannot protect the inorganic layer 16 appropriately, the inorganic layer 16 is damaged to exhibit low gas barrier properties and the scratch resistance of the OC layer 18 is also low.

In the barrier film of Comparative Example 7 in which the pencil hardness of the OC layer 18 is 4H, the adhesiveness between the OC layer 18 and the inorganic layer 16 is very low, due to low adhesiveness, the gas barrier properties are low, the shape of winding is poor, and the degree of curling is large.

From the above results, the effect of the present invention is obvious.

The present invention can be suitably used for OPV, an organic EL display and the like.

EXPLANATION OF REFERENCES

- 10: (gas) barrier film
- 12: base material
- 14: base organic layer
- 16: inorganic layer
- 18: overcoat layer (OC layer)
- 20: hardcoat layer (HC layer)
- 21: organic film forming apparatus
- 24: inorganic film forming apparatus
- 26: application unit
- 28, 28a, 28b: drying unit
- 30: light irradiation unit
- 32, 56: rotary shaft
- 34, 58: winding shaft
- 36, 38: pair of transport rollers
- 42, 46: material roll
- 48, 73: feed roll
- 49, 70: collecting roll
- 50: feed chamber
- 52: film forming chamber
- 54: winding chamber
- 60, 68, 72, 80: pass roller
- 61, 74, 82: vacuum evacuation means
- 62: drum
- 64: film forming means
- 76, 78: partition wall
- 76a, 78a: opening

What is claimed is:

1. A gas barrier film comprising:
on one surface of a transparent base material,
a gas barrier layer having,
one or more combinations of an inorganic layer and an organic layer, which is a base layer of the inorganic layer, and
an overcoat layer including an organic compound and provided on a surface of the inorganic layer, which is most distant from the base material; and
on a surface of the base material opposite to the surface on which the gas barrier layer is provided,
a hardcoat layer in which particles are dispersed in an organic compound,
wherein a particle diameter of the particles of the hardcoat layer is smaller than a thickness of the overcoat layer,
a pencil hardness of the hardcoat layer is equal to or higher than a pencil hardness of the overcoat layer, and the pencil hardness of the overcoat layer is HB to 3H, and a difference between the pencil hardness of the overcoat layer and the pencil hardness of the hardcoat layer is within 2 grades.

2. The gas barrier film according to claim 1, wherein the thickness of the overcoat layer is larger than a thickness of the hardcoat layer.

3. The gas barrier film according to claim 1, wherein the particle diameter of the particles of the hardcoat layer is 0.4 to 1.8 μm.

4. The gas barrier film according to claim 1, wherein the overcoat layer has a thickness of 2 to 15 μm.

5. The gas barrier film according to claim 3, wherein the overcoat layer has a thickness of 2 to 15 μm.

6. The gas barrier film according to claim 1, wherein the hardcoat layer has a thickness of 2 to 7 μm.

7. The gas barrier film according to claim 3, wherein the hardcoat layer has a thickness of 2 to 7 μm.

8. The gas barrier film according to claim 4, wherein the hardcoat layer has a thickness of 2 to 7 μm.

9. The gas barrier film according to claim 5, wherein the hardcoat layer has a thickness of 2 to 7 μm.

10. The gas barrier film according to claim 1, wherein the hardcoat layer includes a polymer of a (meth)acrylate polymer, a polymer of a (meth)acrylate monomer, and a polymer of the (meth)acrylate polymer and the (meth)acrylate monomer.

11. The gas barrier film according to claim 3, wherein the hardcoat layer includes a polymer of a (meth)acrylate polymer, a polymer of a (meth)acrylate monomer, and a polymer of the (meth)acrylate polymer and the (meth)acrylate monomer.

12. The gas barrier film according to claim 4, wherein the hardcoat layer includes a polymer of a (meth)acrylate polymer, a polymer of a (meth)acrylate monomer, and a polymer of the (meth)acrylate polymer and the (meth)acrylate monomer.

13. The gas barrier film according to claim 5, wherein the hardcoat layer includes a polymer of a (meth)acrylate polymer, a polymer of a (meth)acrylate monomer, and a polymer of the (meth)acrylate polymer and the (meth)acrylate monomer.

14. The gas barrier film according to claim 6, wherein the hardcoat layer includes a polymer of a (meth)acrylate polymer, a polymer of a (meth)acrylate monomer, and a polymer of the (meth)acrylate polymer and the (meth)acrylate monomer.

15. The gas barrier film according to claim 9, wherein the hardcoat layer includes a polymer of a (meth)acrylate polymer, a polymer of a (meth)acrylate monomer, and a polymer of the (meth)acrylate polymer and the (meth)acrylate monomer.

16. The gas barrier film according to claim 1, wherein the particles of the hardcoat layer are formed of polymethyl methacrylate.

17. The gas barrier film according to claim 1, wherein the inorganic layer has a thickness of 10 to 100 nm.

18. The method of producing the gas barrier film according to claim 1 comprising;
forming all the inorganic layers of the gas barrier layer on the one surface of the transparent base material and then
forming the hardcoat layer on the surface of the base material opposite to the surface on which the gas barrier layer is provided.

* * * * *